US012707751B2

(12) United States Patent
Yamada

(10) Patent No.: US 12,707,751 B2
(45) Date of Patent: Aug. 11, 2026

(54) SOLID-STATE IMAGING ELEMENT, IMAGING APPARATUS, AND ELECTRONIC DEVICE

(71) Applicant: SONY SEMICONDUCTOR SOLUTIONS CORPORATION, Kanagawa (JP)

(72) Inventor: Kyosuke Yamada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 388 days.

(21) Appl. No.: 18/580,120

(22) PCT Filed: Mar. 1, 2022

(86) PCT No.: PCT/JP2022/008491
§ 371 (c)(1),
(2) Date: Jan. 17, 2024

(87) PCT Pub. No.: WO2023/007797
PCT Pub. Date: Feb. 2, 2023

(65) Prior Publication Data

US 2024/0339476 A1 Oct. 10, 2024

(30) Foreign Application Priority Data

Jul. 27, 2021 (JP) ................................ 2021-122123

(51) Int. Cl.
*H10F 39/00* (2025.01)
*H04N 25/79* (2023.01)

(52) U.S. Cl.
CPC ........... *H10F 39/811* (2025.01); *H04N 25/79* (2023.01); *H10F 39/018* (2025.01); *H10F 39/809* (2025.01)

(58) Field of Classification Search
CPC .... H10F 39/811; H10F 39/018; H10F 39/809; H10F 39/191; H10F 39/12; H04N 25/79; H04N 25/70
See application file for complete search history.

(56) References Cited

U.S. PATENT DOCUMENTS 9,431,450 B2 * 8/2016 Umebayashi ....... H10F 39/8037
2015/0255500 A1 9/2015 Akahoshi et al.
(Continued)

FOREIGN PATENT DOCUMENTS

JP 2021-089979 6/2021
WO WO 2014/083750 6/2014
(Continued)

OTHER PUBLICATIONS

English Translation of International Search Report prepared by the Japan Patent Office on May 2, 2022, for International Application No. PCT/JP2022/008491, 2 pgs.

*Primary Examiner* — J. E. Schoenholtz
(74) *Attorney, Agent, or Firm* — SHERIDAN ROSS P.C.

(57) ABSTRACT

The present disclosure relates to a solid-state imaging element, an imaging apparatus, and an electronic device that can reduce the effects caused by a PAD electrode being formed. When laminating a Logic substrate smaller than an image sensor, a through hole is formed in the image sensor in such a manner as to form a PAD electrode in an embedded member embedded around the logic substrate. The present disclosure can be applied to an imaging apparatus.

20 Claims, 35 Drawing Sheets

(56) References Cited

U.S. PATENT DOCUMENTS

| | | | |
|---|---|---|---|
| 2018/0197908 A1* | 7/2018 | Miyazawa | H10F 39/8053 |
| 2020/0144322 A1 | 5/2020 | Inoue et al. | |
| 2020/0258924 A1 | 8/2020 | Takachi et al. | |
| 2025/0259952 A1* | 8/2025 | Iwata | H10F 39/107 |

FOREIGN PATENT DOCUMENTS

| | | |
|---|---|---|
| WO | WO 2019/017147 | 1/2019 |
| WO | WO 2019/087764 | 5/2019 |
| WO | WO 2020/184027 | 9/2020 |

* cited by examiner

11
A
B
31
31a
31b
31b-1
31c-1
31c-2
31c-3
31c-4
32
33
34
34a
34b
51
52
53
53a-1
53a-2
53a-3
53a-4
54
54a
55
Sensor SUBSTRATE
Logic SUBSTRATE
SUPPORT SUBSTRATE
PAD ELECTRODE
EMBEDDED MEMBER

54A-2
33A
54A-1
61A-2
55A
34A-2
53A
61A-1
34A-1
31A 52A
61A-2
51A
11A
32A
34A-1
61A-1
34-2
Logic SUBSTRATE
SUPPORT SUBSTRATE
EMBEDDED MEMBER
31A
54A-1
54Aa-1
33A
53
54A-2
55A 11D
32D
51D
53D
52D
34D-1
34-2
81
82
83
31D
54D-1
54Da-1
33D
53D
53Db
54D-2
55D 201-1
201-2
134a-1
134b-1
REARRANGED SUBSTRATE
134-2-1
134a-2-1
134b-2-1
REARRANGED SUBSTRATE
134-1
134-2-2
134a-2-2
134b-2-2

201-2
REARRANGED SUBSTRATE
134b-2-2
134a-2-2
134-2-2
134-2-1
134b-2-1
134a-2-1
SUPPORT SUBSTRATE
155

201-1
REARRANGED SUBSTRATE
134-1
134b-1
134a-1
134-2-2
134-2-1
153-2
154-2
155

SOLID-STATE IMAGING ELEMENT, IMAGING APPARATUS, AND ELECTRONIC DEVICE

TECHNICAL FIELD

The present disclosure relates to a solid-state imaging element, an imaging apparatus, and an electronic device, and particularly to a solid-state imaging element, an imaging apparatus, and an electronic device that can reduce the effects that are caused when a PAD electrode is formed.

BACKGROUND ART

When a single semiconductor device is configured by a plurality of semiconductor elements being laminated, a technique has been proposed to realize downsizing and improvement in theoretical yield by collecting, arranging, and laminating only good chips (see PTL 1).

CITATION LIST

Patent Literature

PTL 1: PCT Patent Publication No. WO2019/087764

SUMMARY

Technical Problems

However, in the semiconductor device configured by the technique described in PTL 1, if a PAD electrode is to be arranged in a wiring layer of the downsized semiconductor device, the arrangement area of the circuit is reduced due to the arrangement area of the PAD electrode.

In addition, if a PAD electrode is formed in a large semiconductor element, the wiring distance from a small semiconductor element to the PAD electrode becomes longer, and the parasitic capacitance generated in the wiring increases.

The present disclosure has been made in view of such a situation, and can particularly reduce the effects that are caused when a PAD electrode is formed.

Solution to Problems

A solid-state imaging element, an imaging apparatus, and an electronic device according to an aspect of the present disclosure are a solid-state imaging element, an imaging apparatus, and an electronic device in which a first semiconductor element having an imaging element for photoelectrically converting incident light is provided, a second semiconductor element smaller than the first semiconductor element having a signal processing circuit for processing a pixel signal of the imaging element is provided, the circumference of the second semiconductor element is embedded with an embedded member, and a PAD electrode is formed in the embedded member.

In the aspect of the present disclosure, a first semiconductor element having an imaging element for photoelectrically converting incident light is provided, a second semiconductor element smaller than the first semiconductor element having a signal processing circuit for processing a pixel signal of the imaging element is provided, the circumference of the second semiconductor element is embedded with an embedded member, and a PAD electrode is formed in the embedded member.

BRIEF DESCRIPTION OF DRAWINGS

FIG. 12 is a diagram for describing a first step of a manufacturing method of the solid-state imaging apparatus illustrated in FIG. 11.

FIG. 15 is a diagram for describing a fourth step of the manufacturing method of the solid-state imaging apparatus illustrated in FIG. 11.

FIG. 16 is a diagram for describing a fifth step of the manufacturing method of the solid-state imaging apparatus illustrated in FIG. 11.

FIG. 25 is a diagram for describing a third step of the manufacturing method of the solid-state imaging apparatus illustrated in FIG. 21 and FIG. 22.

FIG. 26 is a diagram for describing a fourth step of the manufacturing method of the solid-state imaging apparatus illustrated in FIG. 21 and FIG. 22.

FIG. 28 is a diagram for describing a sixth step of the manufacturing method of the solid-state imaging apparatus illustrated in FIG. 21 and FIG. 22.

FIG. 29 is a diagram for describing a seventh step of the manufacturing method of the solid-state imaging apparatus illustrated in FIG. 21 and FIG. 22.

DESCRIPTION OF EMBODIMENTS

Figure 1:
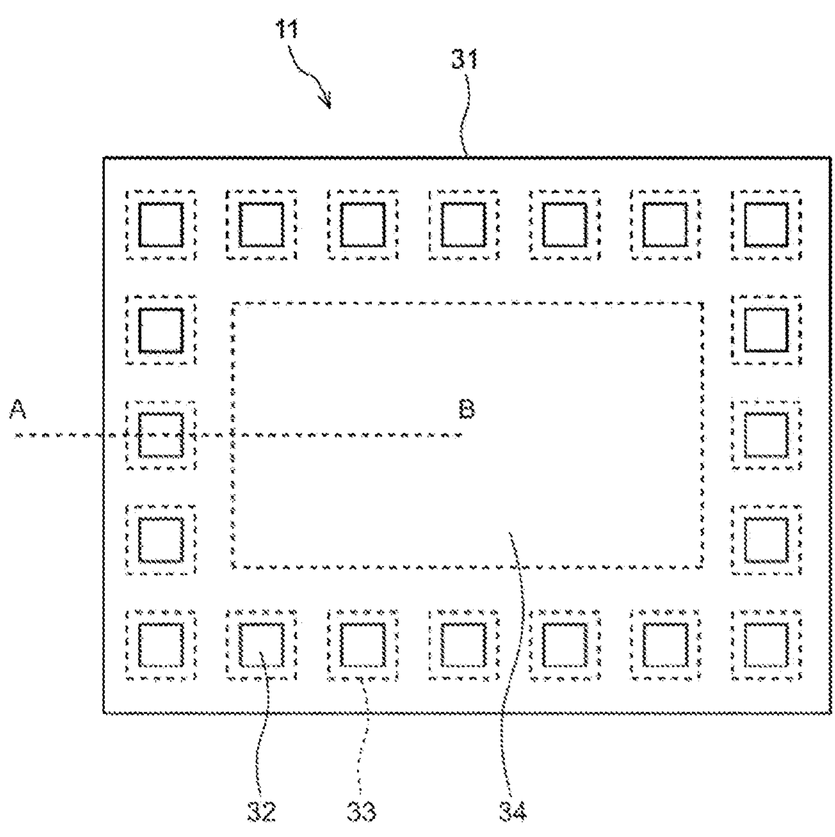
FIG. 1 is a top view of a configuration example of a solid-state imaging apparatus according to a first embodiment of the present disclosure.

Preferred embodiments of the present disclosure will be described in detail below with reference to the accompanying drawings. It should be noted that, in the specification and the drawings, constitutional elements having substantially the same functional configurations will be denoted by the same reference signs, and the duplicate descriptions will be omitted.

Hereinafter, modes for carrying out the present technique will be described. Descriptions will be given in the following order.

1. First Embodiment
2. Second Embodiment
3. First application of second embodiment
4. Second application of second embodiment
5. Third application of second embodiment
6. Third Embodiment
7. Examples of application to electronic device
8. Examples of using solid-state imaging element
9. Application to mobile body

1. First Embodiment

Figure 2:
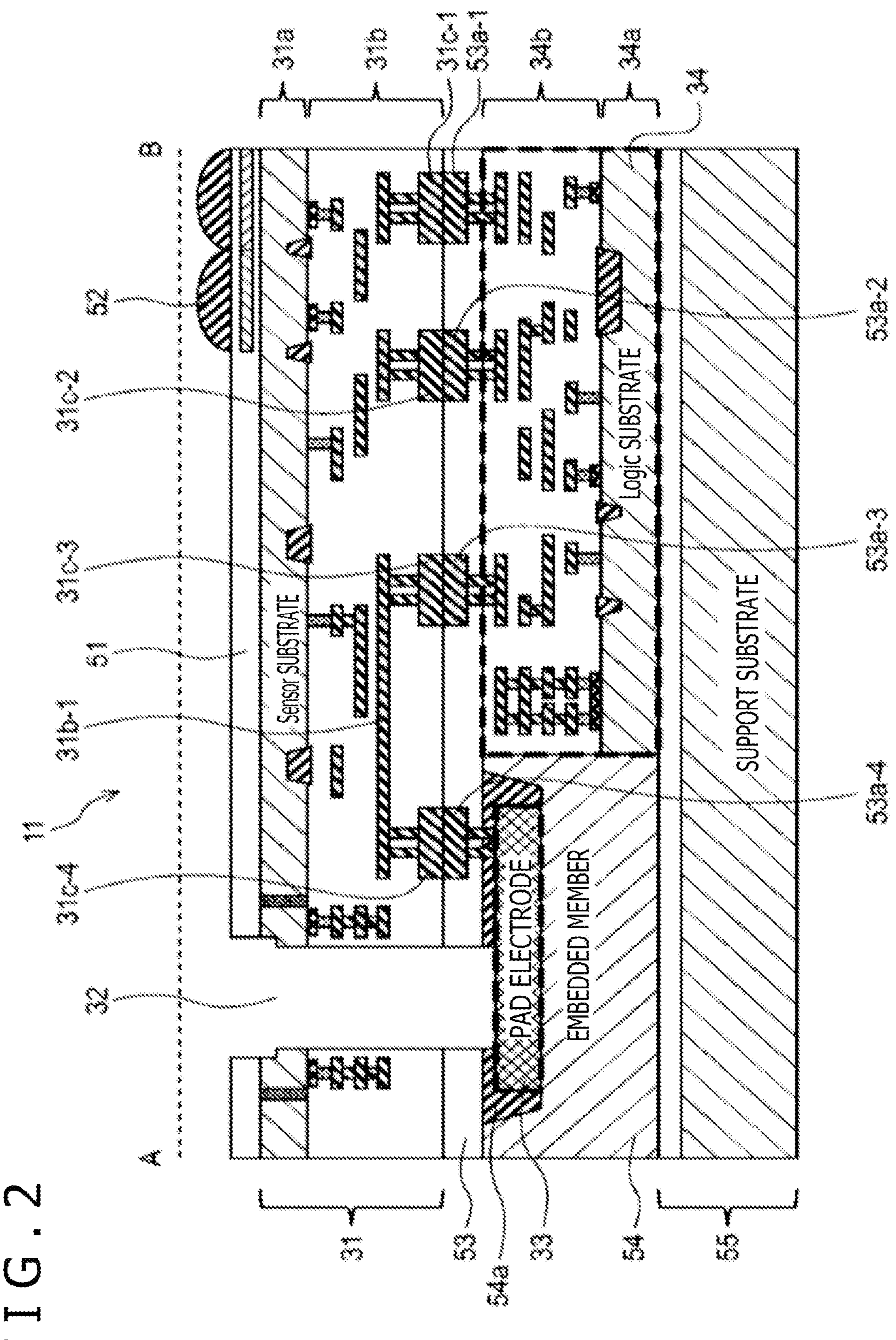
FIG. 2 is an AB cross-sectional view of FIG. 1.

FIG. 1 and FIG. 2 depict configuration examples of a solid-state imaging element according to the first embodiment of the present disclosure.

FIG. 1 depicts a top view when viewing a solid-state imaging element 11 from the incident direction of incident light, and FIG. 2 is an AB cross-sectional view of the solid-state imaging element 11 of FIG. 1.

As depicted in FIG. 2, in the solid-state imaging element 11, a layer including a support substrate 55, a layer including a Logic substrate 34, a layer including an oxide film 53, and a layer including an image sensor 31 are laminated from the bottom in this order.

The image sensor 31 includes a photoelectric conversion layer 31*a* and a wiring layer 31*b*, and in the wiring layer 31*b*, terminals 31*c*-1 to 31*c*-4 that are electrically CuCu joined are formed at positions facing terminals 53*a*-1 to 53*a*-4 formed in the oxide film 53.

In addition, on the upper surface of the image sensor (Sensor substrate) 31, an on-chip filter 51 for allowing incident light corresponding to the wavelength of RGB to transmit therethrough and an on-chip lens 52 for collecting the incident light in the photoelectric conversion layer 31*a* are formed from the lower side.

The Logic substrate 34 includes a circuit that executes various kinds of signal processing for pixel signals configuring an image captured by the image sensor 31, is manufactured by a wafer, and is diced into pieces, and those that are confirmed to be good ones by electrical inspection are selected and laminated on the support substrate 55. In addition, in the Logic substrate 43, a silicon layer 34*a* is formed at a lower part in the drawing, and a wiring layer 34*b* is formed at an upper part.

As depicted in FIG. 1, the Logic substrate 34 has a rectangular configuration smaller than the image sensor 31 when viewed from the top, and hence, when the image sensor 31 is laminated on the Logic substrate 34, a gap is formed between the image sensor 31 and the support substrate 55 in such a manner as to surround the Logic substrate 34. An embedded member 54 is embedded in the gap part.

Further, as depicted in FIG. 1 and FIG. 2, rectangular and recessed trenches 54*a* are formed at predetermined intervals in the embedded member 54 in such a manner as to surround the Logic substrate 34, and rectangular PAD electrodes 33 are formed in the respective trenches 54*a*.

In addition, as depicted in FIG. 1, in the image sensor 31, a through hole 32 having a rectangular shape smaller than the PAD electrode 33 and penetrating the image sensor 31 is formed on the PAD electrode 33.

Hence, an unillustrated wire (metal wiring) which is connected to an external signal processing unit is bonded (connected) to the PAD electrode 33 by being inserted into the through hole 32.

With such a configuration, in the solid-state imaging element 11 of FIG. 1 and FIG. 2, the unillustrated wire is electrically connected to the Logic substrate 34 via the PAD electrode 33, the terminals 53*a*-4 and 31*c*-4, wiring 31*b*-1, the terminals 31*c*-3 and 53*a*-3, and the image sensor 31.

Accordingly, the PAD electrode 33 can be formed and laid out outside the wiring layer of the Logic substrate 34, which is a small semiconductor element, making it possible to improve the area efficiency related to the arrangement of the PAD electrode 33.

In addition, since solder connection is performed with heating in the wire bond, if wiring or the like exists directly under the PAD electrode 33, it may be damaged due to heating.

However, as depicted in FIG. 2, in the solid-state imaging element 11 of the present disclosure, since the PAD electrode 33 is formed in the trench 54*a* of the embedded member 54, no wiring exists directly under the PAD electrode 33, making it possible to suppress the damage to the wiring related to the solder connection with heating.

Further, by configuring a metal part such as aluminum that configures the PAD electrode 33 in the trench 54*a* inside the embedded member 54, an HDP (High Density Plasma) film is not necessary, making it possible to reduce the effects of hydrogen caused by HDP.

In addition, since the PAD electrode 33 is embedded in the embedded member 54, the parasitic capacitance can be reduced as compared with a case where the PAD electrode 33 is formed in a semiconductor element such as the Logic substrate 34. Further, using a material with a lower dielectric constant for the material of the embedded member 54 makes it possible to further reduce the parasitic capacitance that occurs in the case where the PAD electrode 33 is formed.

That is, in the solid-state imaging element 11 of the present disclosure, the configuration depicted in FIG. 1 and FIG. 2 can reduce various kinds of effects that occur when the PAD electrode 33 is formed.

<Manufacturing Method of Solid-State Imaging Element of FIG. 1 and FIG. 2>

Next, a manufacturing method of the solid-state imaging element 11 of FIG. 1 and FIG. 2 will be described with reference to FIG. 3 to FIG. 10.

Figure 3:
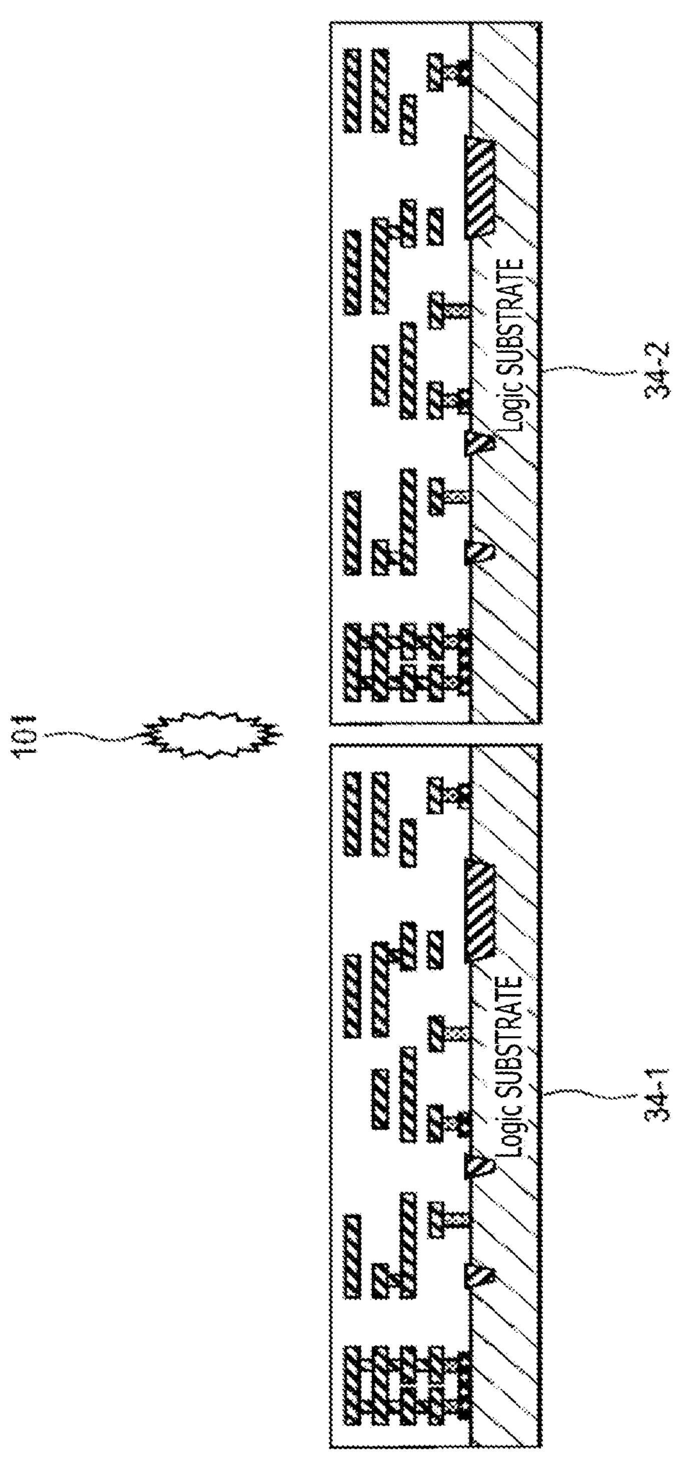
FIG. 3 is a diagram for describing a first step of a manufacturing method of the solid-state imaging apparatus illustrated in FIG. 1 and FIG. 2.

As a first step, as depicted in FIG. 3, a plurality of Logic substrates 34 are formed on an unillustrated wafer, thinned, and diced by a cutter 101. FIG. 3 depicts that Logic substrates 34-1 and 34-2 are manufactured by being diced by the cutter 101.

Figure 4:
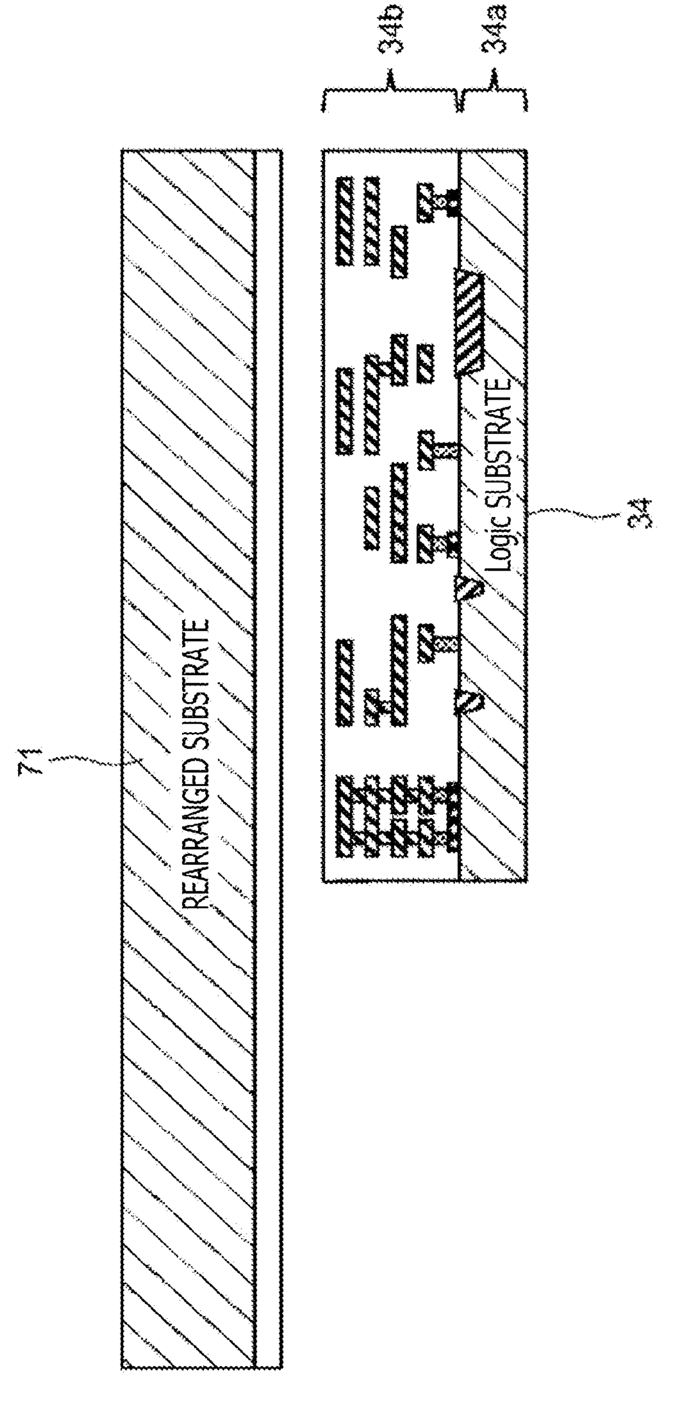
FIG. 4 is a diagram for describing a second step of the manufacturing method of the solid-state imaging apparatus illustrated in FIG. 1 and FIG. 2.

As a second step, as depicted in FIG. 4, among the diced Logic substrates 34, a good one is selected by electrical inspection and temporarily joined on a rearranged substrate 71. At this time, the wiring layer 34*b* of the Logic substrate 34 and the rearranged substrate 71 are temporarily joined in such a manner as to face each other.

Figure 5:
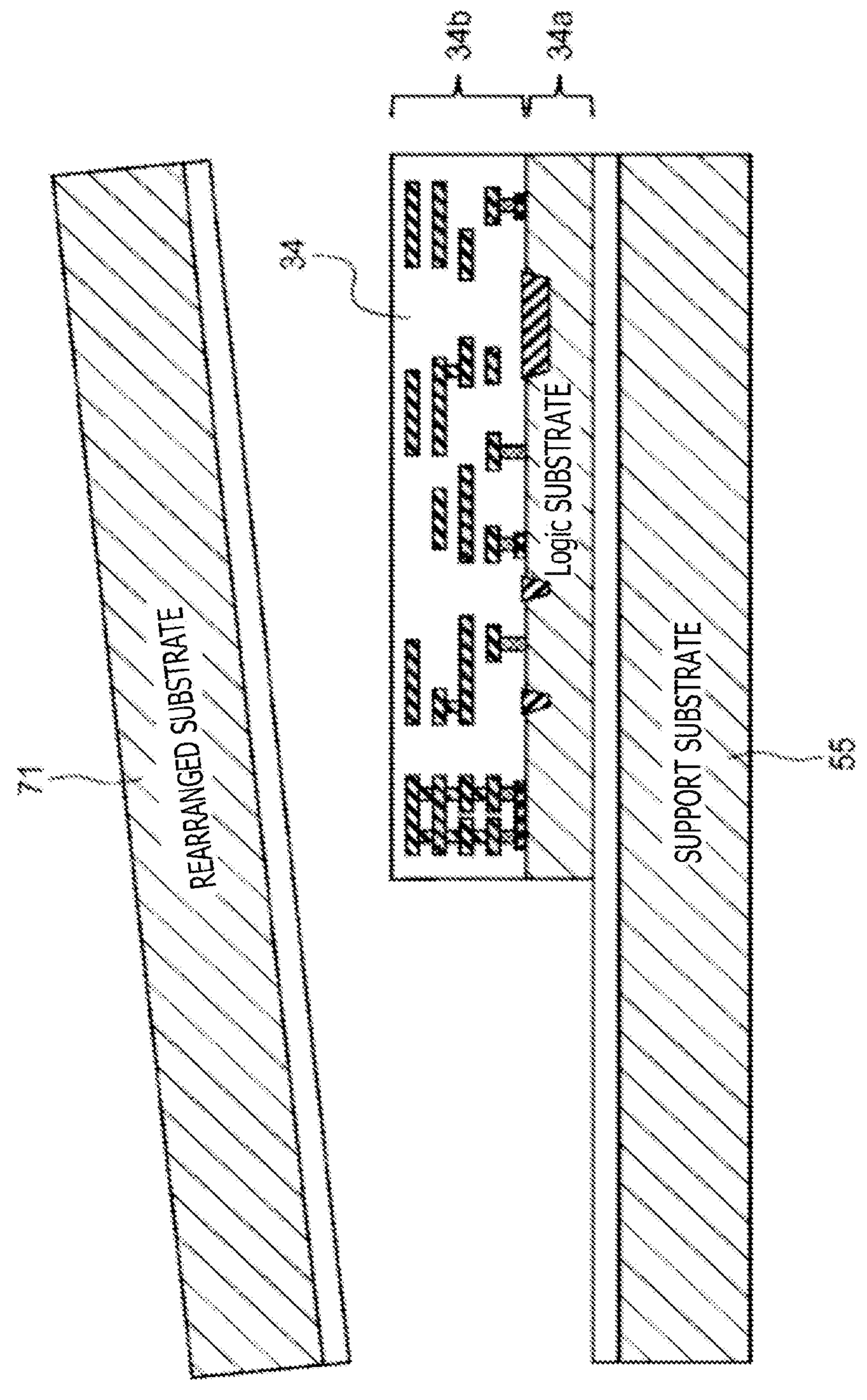
FIG. 5 is a diagram for describing a third step of the manufacturing method of the solid-state imaging apparatus illustrated in FIG. 1 and FIG. 2.

As a third step, as depicted in FIG. 5, the Logic substrate 34 temporarily joined on the rearranged substrate 71 is joined in such a manner that the silicon layer 34*a* is pasted in the direction facing the support substrate 55.

Figure 6:
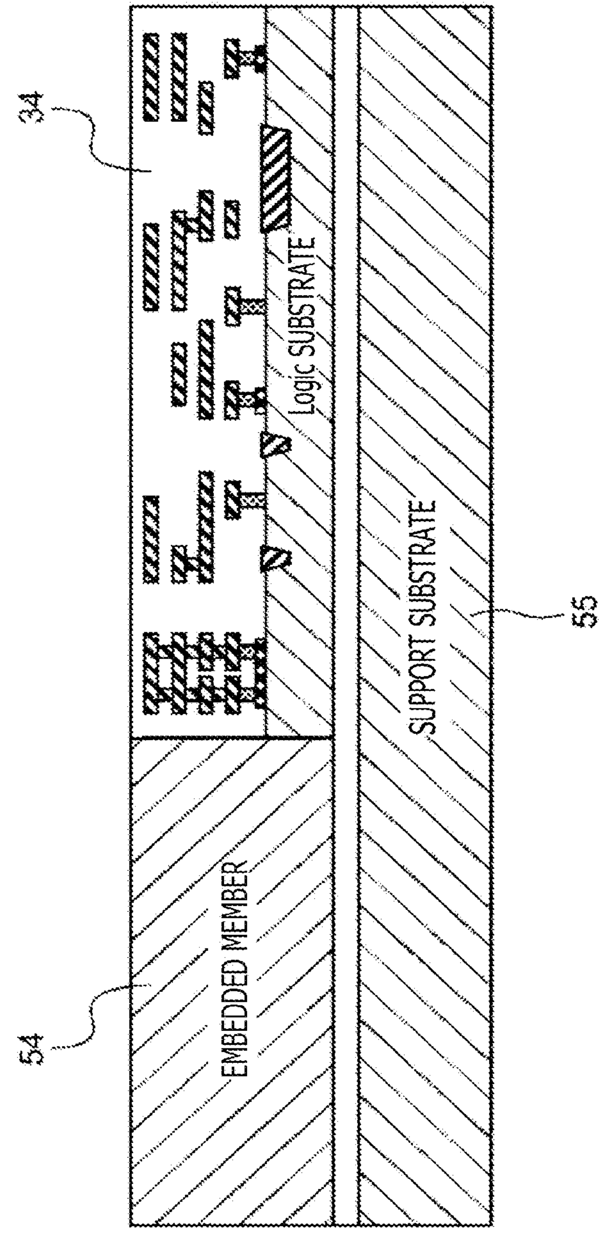
FIG. 6 is a diagram for describing a fourth step of the manufacturing method of the solid-state imaging apparatus illustrated in FIG. 1 and FIG. 2.

As a fourth step, as depicted in FIG. 6 and described with reference to FIG. 1, the embedded member 54 is embedded at the outer periphery surrounding the logic substrate 34 and at the same thickness as the Logic substrate 34.

Figure 7:
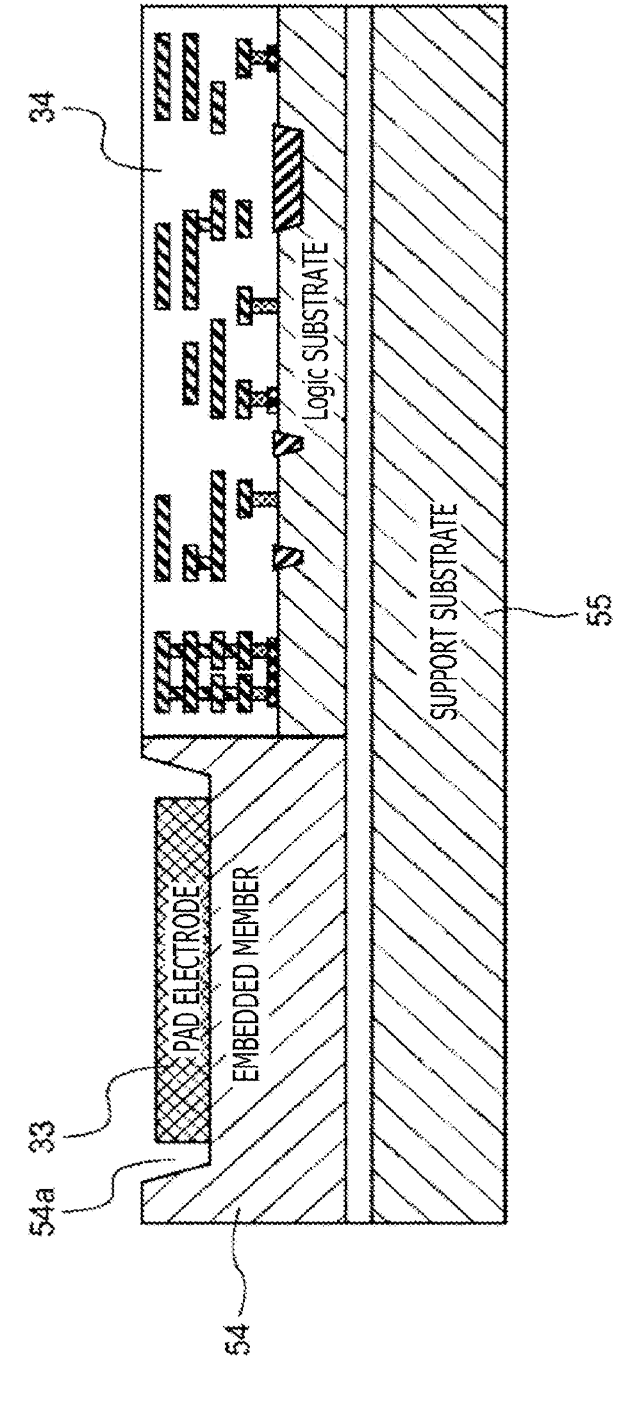
FIG. 7 is a diagram for describing a fifth step of the manufacturing method of the solid-state imaging apparatus illustrated in FIG. 1 and FIG. 2.

As a fifth step, as depicted in FIG. 7 and described with reference to FIG. 1, the recessed trenches 54*a* that are formed in a rectangular shape when viewed from the top are formed from the side at predetermined intervals in such a manner as to surround the Logic substrate 34, and further the PAD electrode 33 is formed in the trench 54*a*.

Figure 8:
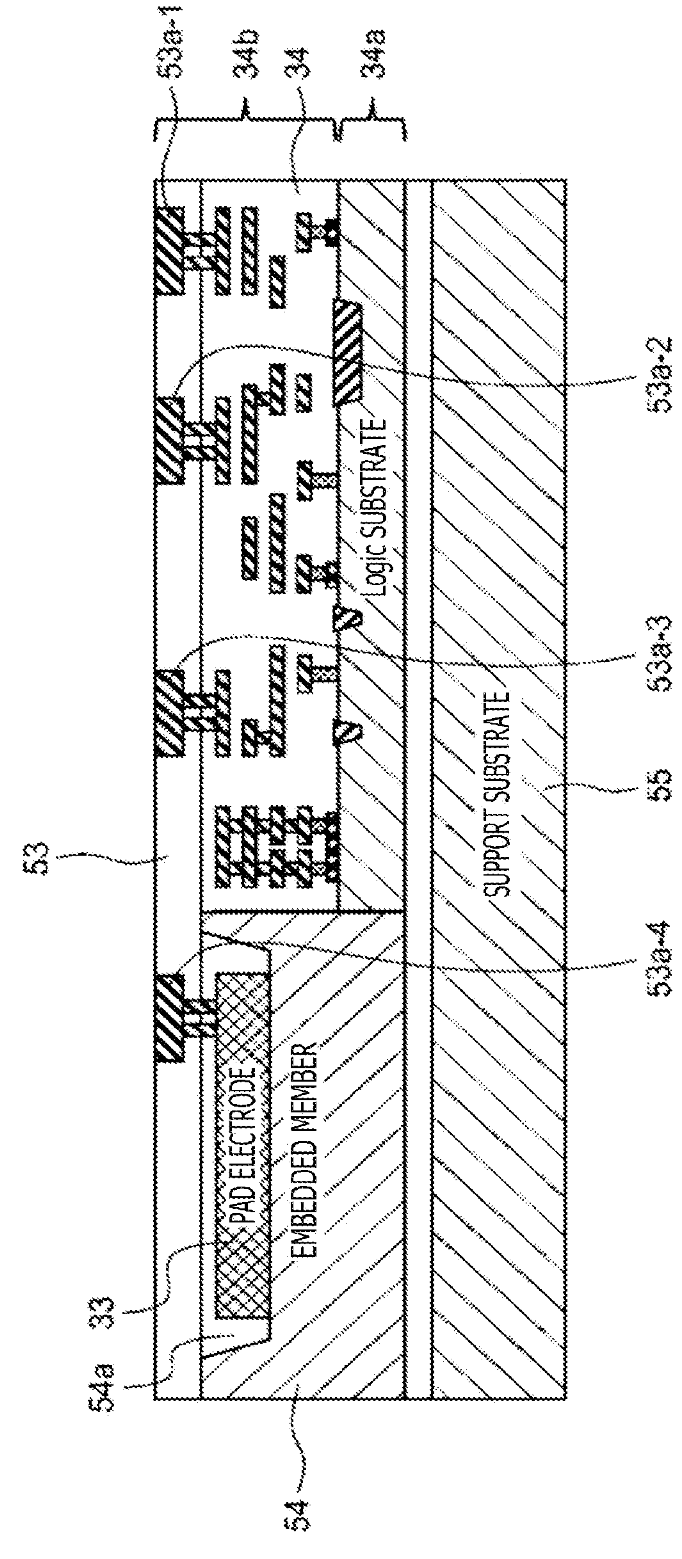
FIG. 8 is a diagram for describing a sixth step of the manufacturing method of the solid-state imaging apparatus illustrated in FIG. 1 and FIG. 2.

As a sixth step, as depicted in FIG. 8, the terminals 53*a*-1 to 53*a*-4 are connected to the PAD electrode 33 and the wiring layer 34*b* of the Logic substrate 34, and the oxide film 53 is formed on the embedded member 54, including the trench 54*a* and the PAD electrode 33, and the Logic substrate 34.

Figure 9:
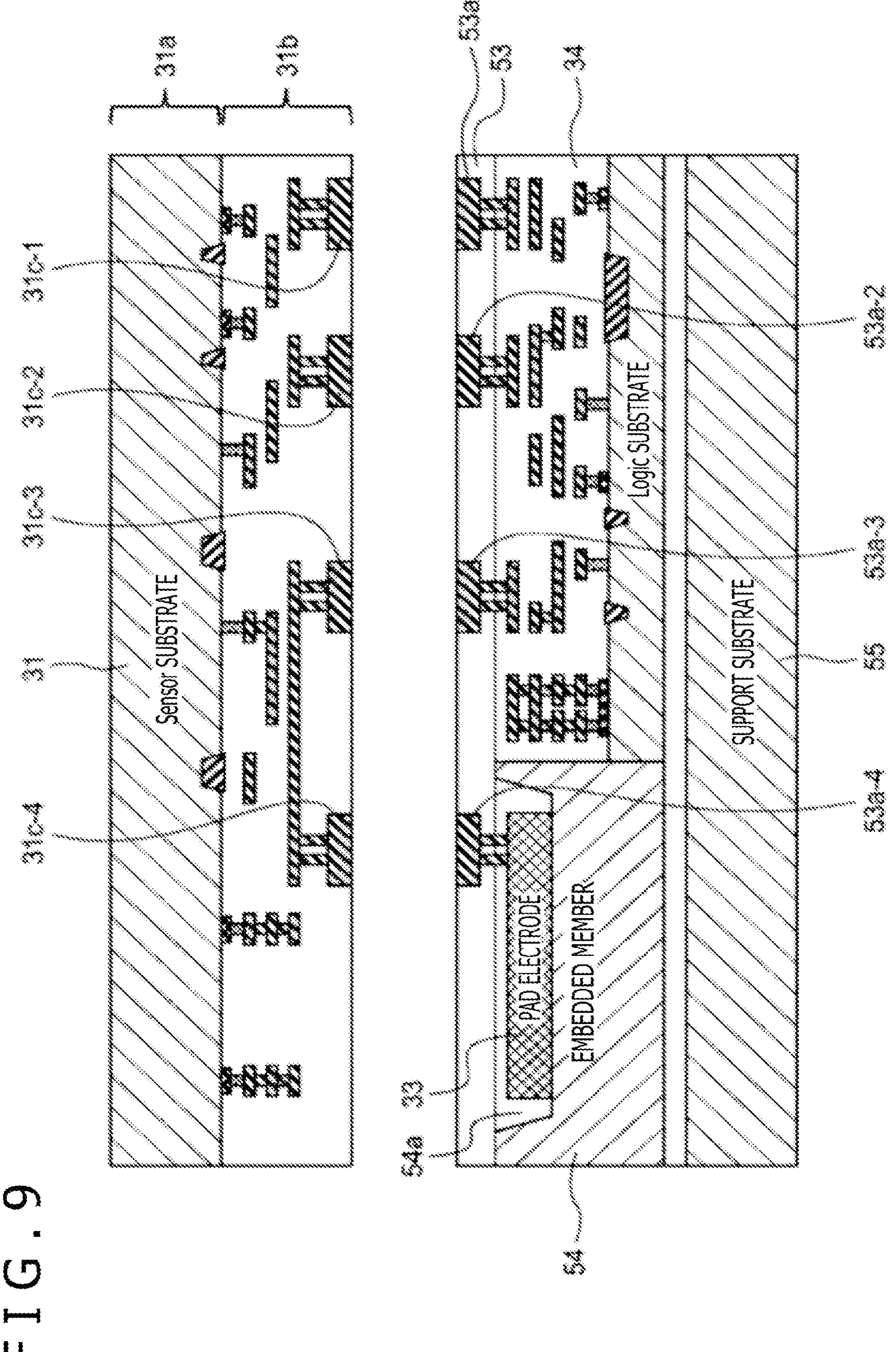
FIG. 9 is a diagram for describing a seventh step of the manufacturing method of the solid-state imaging apparatus illustrated in FIG. 1 and FIG. 2.

As a seventh step, as depicted in FIG. 9, the terminals 31*c*-1 to 31*c*-4 of the wiring layer 31*b* of the image sensor 31 and the terminals 53*a*-1 to 53*a*-4 of the oxide film 53 are CuCu joined in a facing state.

Figure 10:
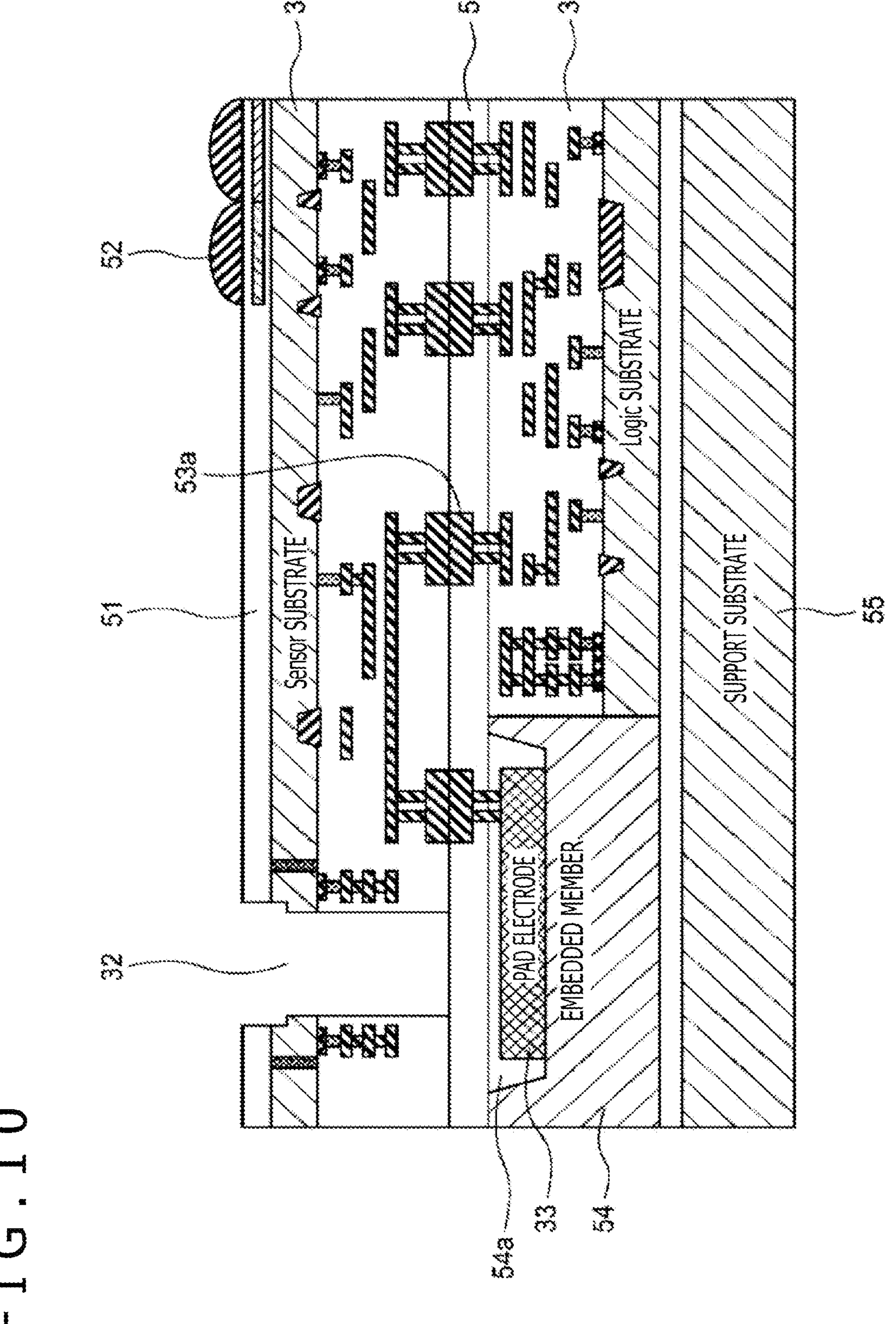
FIG. 10 is a diagram for describing an eighth step of the manufacturing method of the solid-state imaging apparatus illustrated in FIG. 1 and FIG. 2.

As an eighth step, as depicted in FIG. 10, after the photoelectric conversion layer 31*a* of the image sensor 31 is thinned and the on-chip filter 51 and the on-chip lens 52 are laminated on the image sensor 31, the rectangular through hole 32, which is smaller than the PAD electrode 33 when viewed from the top, is formed at a position corresponding to the PAD electrode 33 in such a manner as to penetrate the image sensor 31, and the solid-state imaging element 11 is completed.

2. Second Embodiment

Although the example in which one Logic substrate 34 is laminated on the support substrate 55 and the image sensor 31 is further laminated has been described above, two Logic substrates 34 may be laminated on the support substrate 55, and then the image sensor 31 may be laminated.

Figure 11:
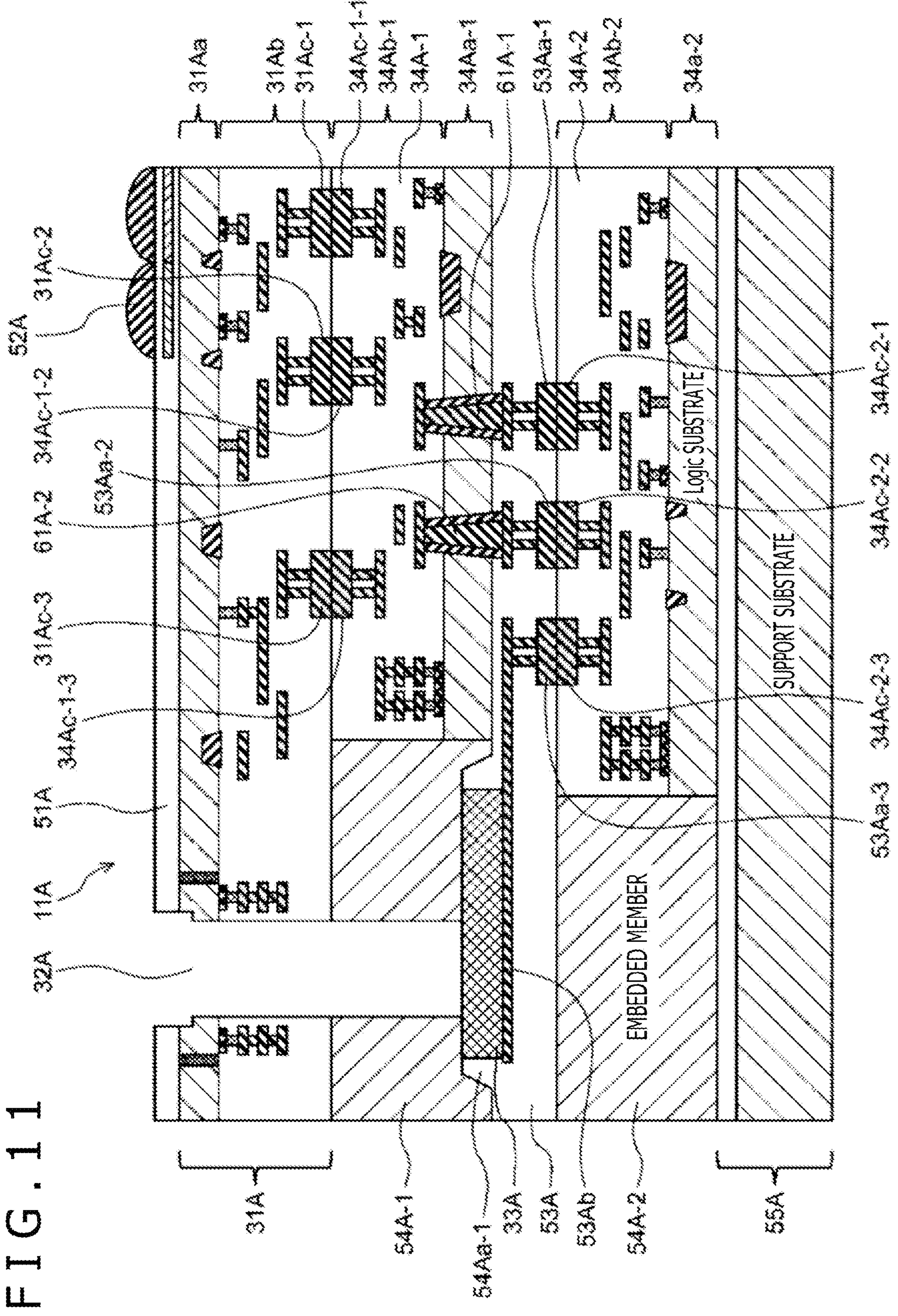
FIG. 11 is a cross-sectional view of a configuration example of a solid-state imaging apparatus according to a second embodiment of the present disclosure.

FIG. 11 depicts a configuration example of a solid-state imaging element 11A in which two Logic substrates 34 are laminated on the support substrate 55.

It should be noted that, in the solid-state imaging element 11A of FIG. 11, configurations having functions corresponding to those of the configurations in the solid-state imaging element 11 of FIG. 1 and FIG. 2 are indicated by adding "A" to the reference signs, and the descriptions thereof will be omitted as appropriate.

The difference between the solid-state imaging element 11A of FIG. 11 and the solid-state imaging element 11 of FIG. 1 and FIG. 2 is that two logic substrates 34A-1 and 34A-2 are laminated.

In both the Logic substrates 34A-1 and 34A-2, silicon layers 34Aa-1 and 34Aa-2 are formed at lower parts in the drawing, and wiring layers 34Ab-1 and 34Ab-2 are formed thereon.

Three terminals 53Aa are formed between the Logic substrates 34A-1 and 34A-2 at positions facing terminals 34Ac-2 of the Logic substrate 34A-2, and are electrically connected.

Further, in the solid-state imaging element 11A, terminals 53Aa-1 to 53Aa-3 located at positions facing terminals 34Ac-2-1 to 34Ac-2-3 of the three sets of Logic substrates 34A-2 illustrated in FIG. 11 are CuCu joined.

Through electrodes 61A-1 and 61A-2 penetrating the silicon layer 34Aa-1 are formed in the logic substrate 34A-1, and the through electrodes 61A-1 and 61A-2 are connected to the terminals 53Aa-1 and 53Aa-2, respectively, so that the Logic substrates 34A-1 and 34A-2 are electrically connected to each other.

In addition, the terminal 34Ac-2-3 of the Logic substrate 34A-2 is CuCu joined to the terminal 53Aa-3 of an oxide film 53A, which is provided at an opposite position, and further the terminal 53Aa-3 is connected to a PAD electrode 33A via wiring 53Ab in the oxide film 53A. Accordingly, the Logic substrate 34A-2 is electrically connected to the PAD electrode 33.

Further, the PAD electrode 33A is formed in a trench 54Aa that is formed in an embedded member 54A-1 of the logic substrate 34A-1 and that is recessed in an upward direction in the drawing.

In addition, an image sensor 31A penetrating a through hole 32A and the Logic substrate 34A-1 is formed directly above the PAD electrode 33A in the drawing.

With such a configuration, even in the solid-state imaging element 11A of FIG. 11, various kinds of effects that occur when the PAD electrode 33 is formed can be reduced as in the solid-state imaging element 11 of FIG. 1 and FIG. 2.

<Manufacturing Method of Solid-State Imaging Element of FIG. 11>

Next, a manufacturing method of the solid-state imaging element 11A of FIG. 11 will be described with reference to FIG. 12 to FIG. 17.

Figure 12:
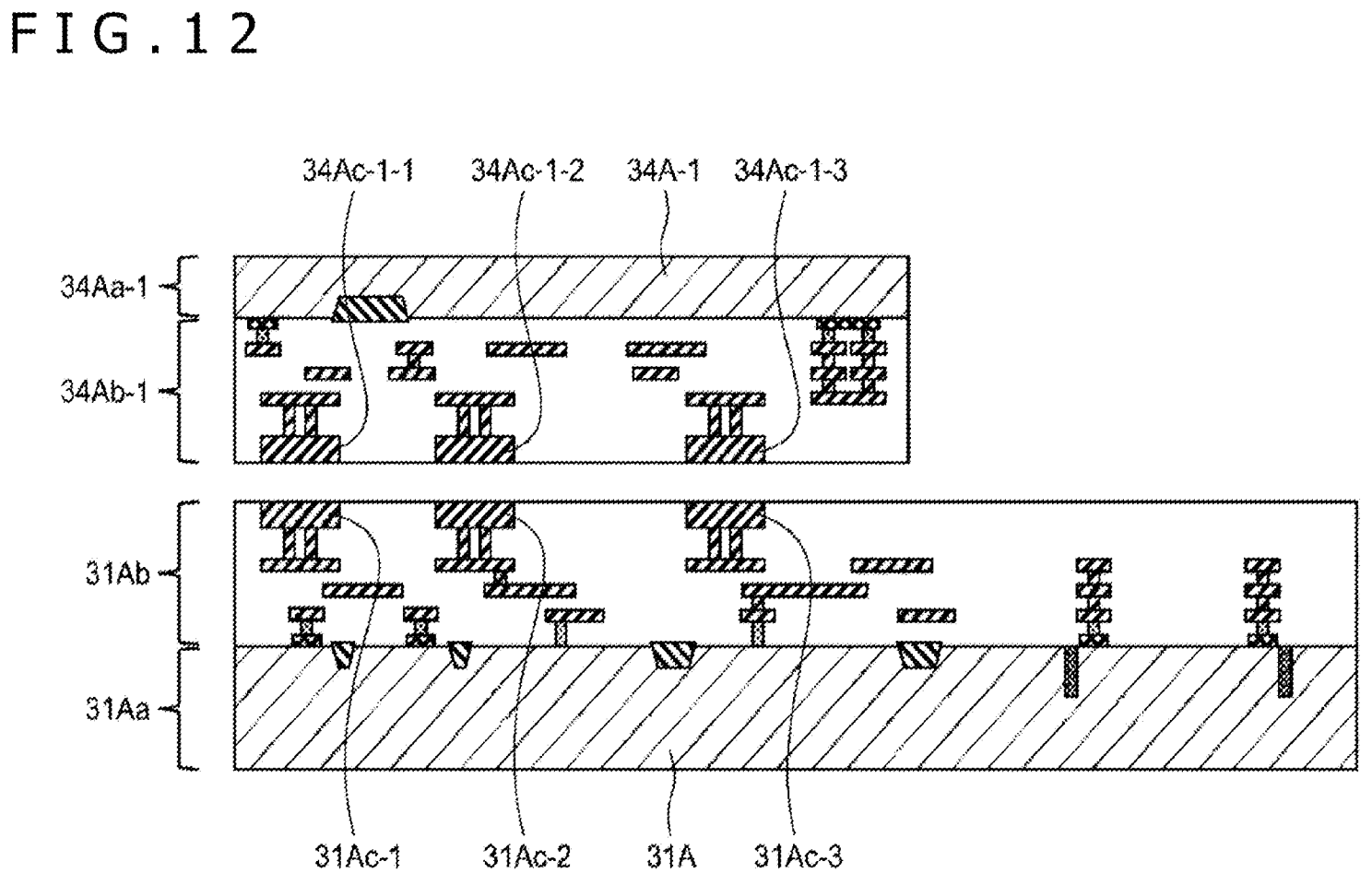

As a first step, as depicted in FIG. 12, the diced Logic substrate 34A-1 and the image sensor 31A are joined to each other. At this time, terminals 34Ac-1-1 to 34Ac-1-3 of a wiring layer 34Ab-1 of the Logic substrate 34A-1 are CuCu joined to terminals 31Ac-1 to 31Ac-3 of a wiring layer 31Ab of the image sensor 31, which are provided at opposite positions, respectively.

Figure 13:
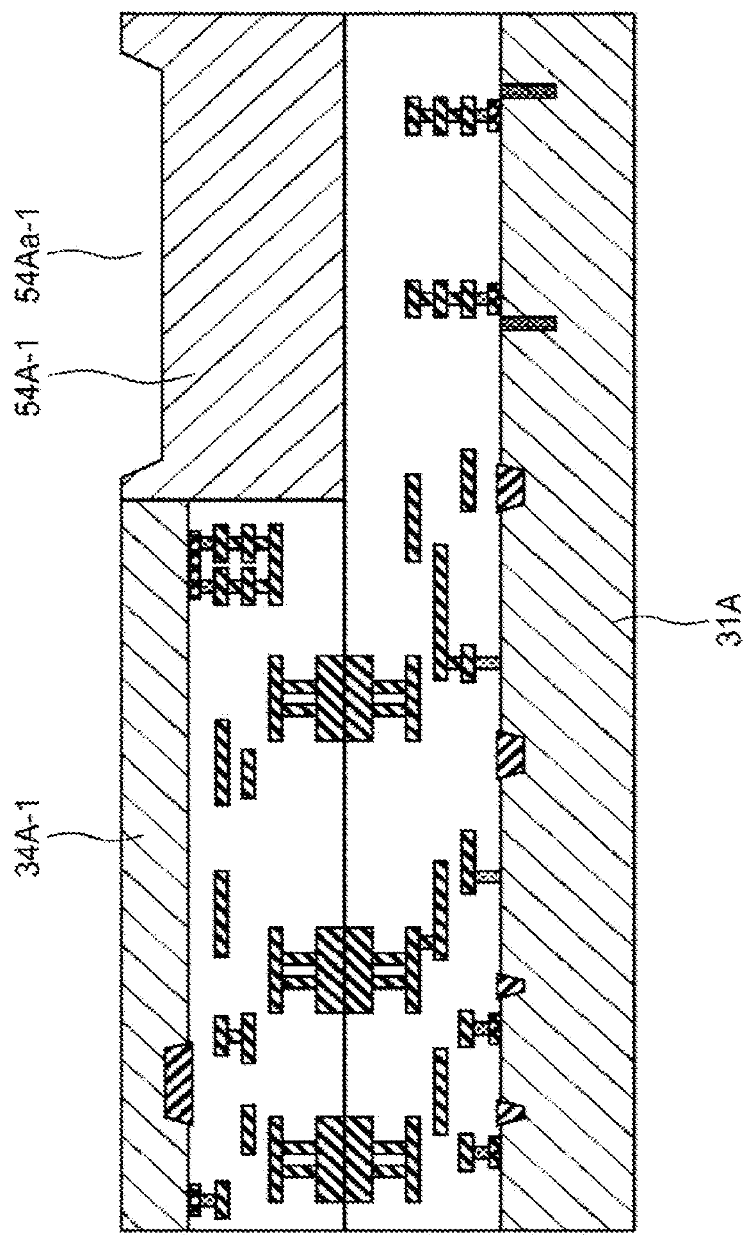
FIG. 13 is a diagram for describing a second step of the manufacturing method of the solid-state imaging apparatus illustrated in FIG. 11.

As a second step, as depicted in FIG. 13, the embedded member 54A-1 is embedded at the outer periphery surrounding the Logic substrate 34A-1 and at the same thickness as the Logic substrate 34A-1, and further, rectangular trenches 54Aa-1 are formed at predetermined intervals in the embedded member 54A-1 so as to surround the Logic substrate 34A-1.

Figure 14:
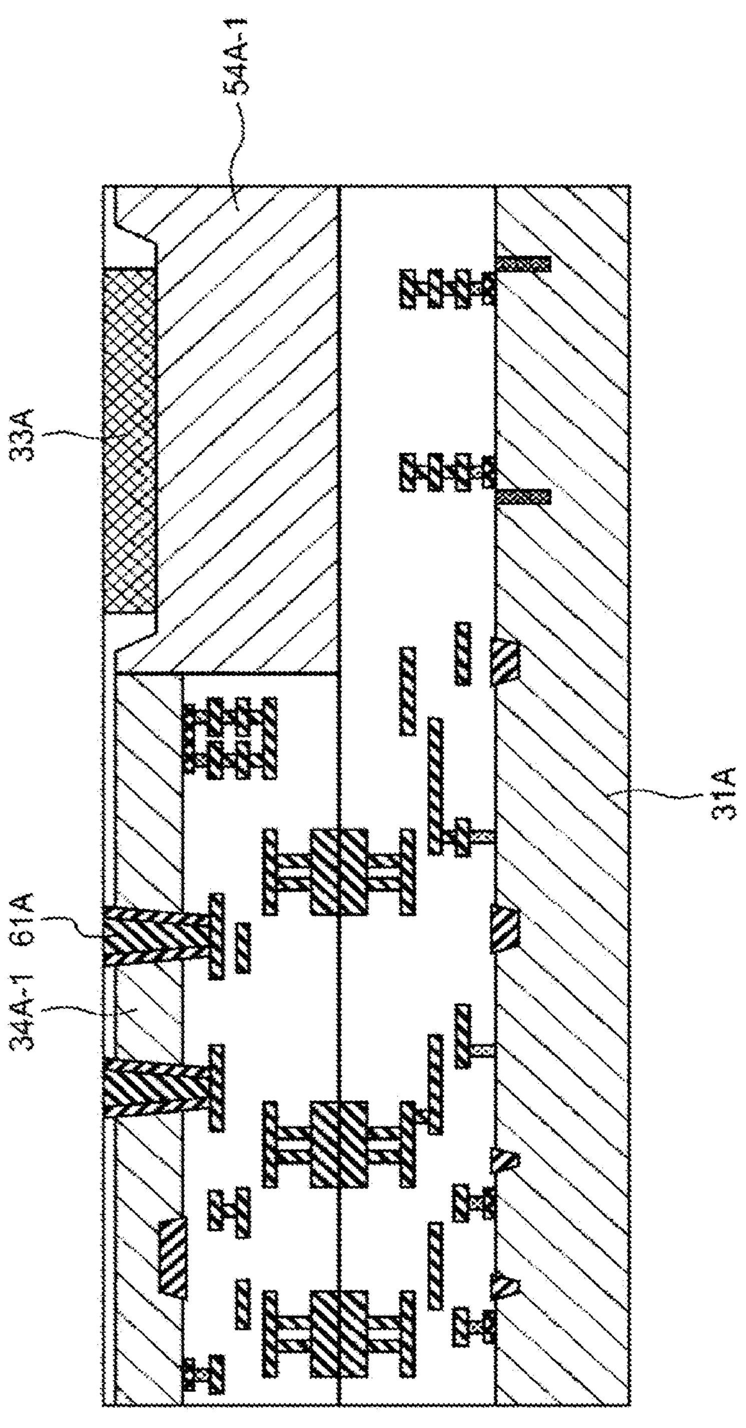
FIG. 14 is a diagram for describing a third step of the manufacturing method of the solid-state imaging apparatus illustrated in FIG. 11.

As a third step, as depicted in FIG. 14, the PAD electrode 33A is formed in the trench 54Aa-1, and a through electrode 61A is also formed.

Figure 15:
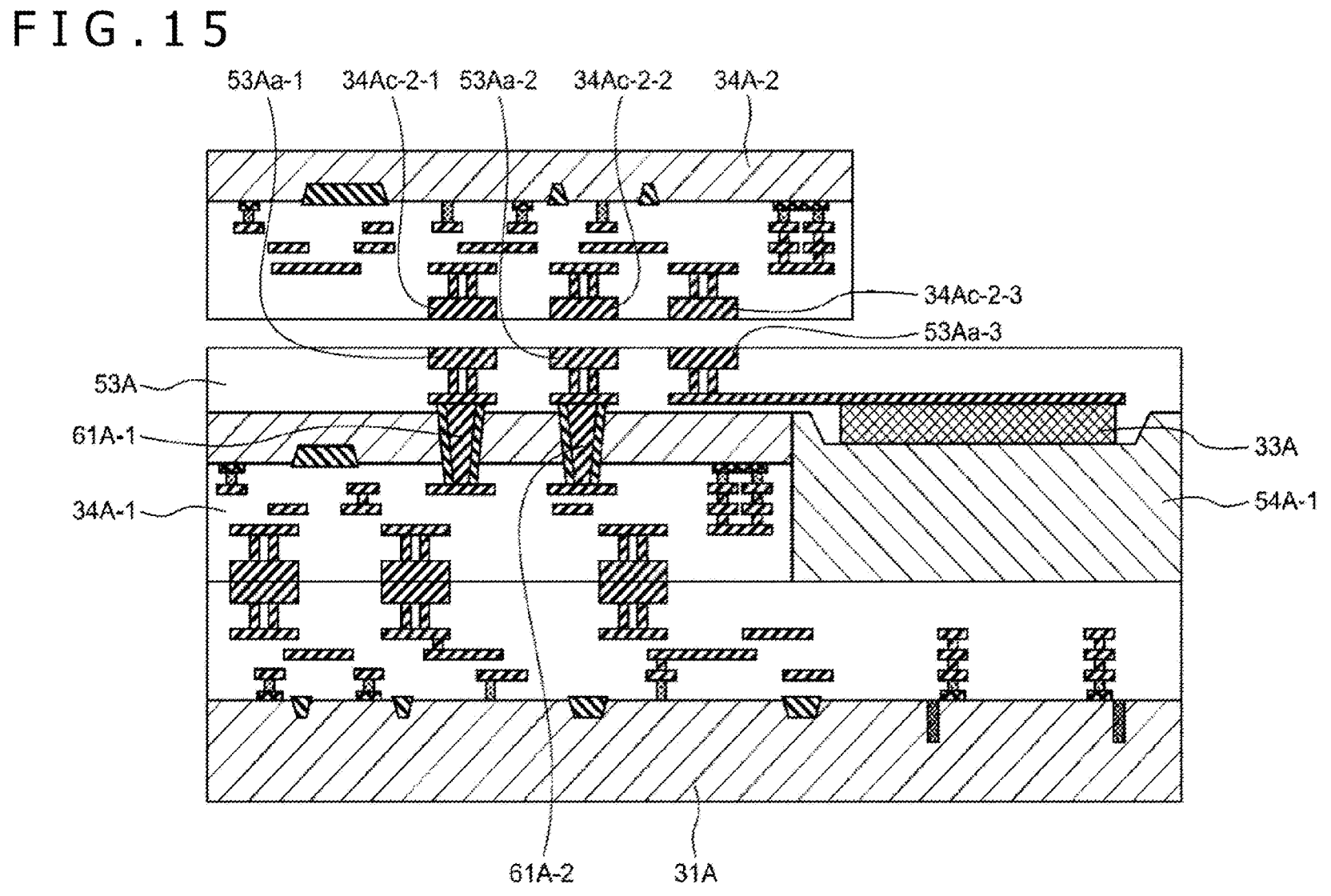

As a fourth step, as depicted in FIG. 15, the oxide film 53 is formed, and further the terminals 53Aa-1 to 53Aa-3 are formed. Further, the terminals 53Aa-1 to 53Aa-3 and the terminals 34Ac-2-1 to 34Ac-2-3 are CuCu joined to each other while facing each other, and the oxide film 53 and the Logic substrate 34-2 are joined to each other.

Figure 16:
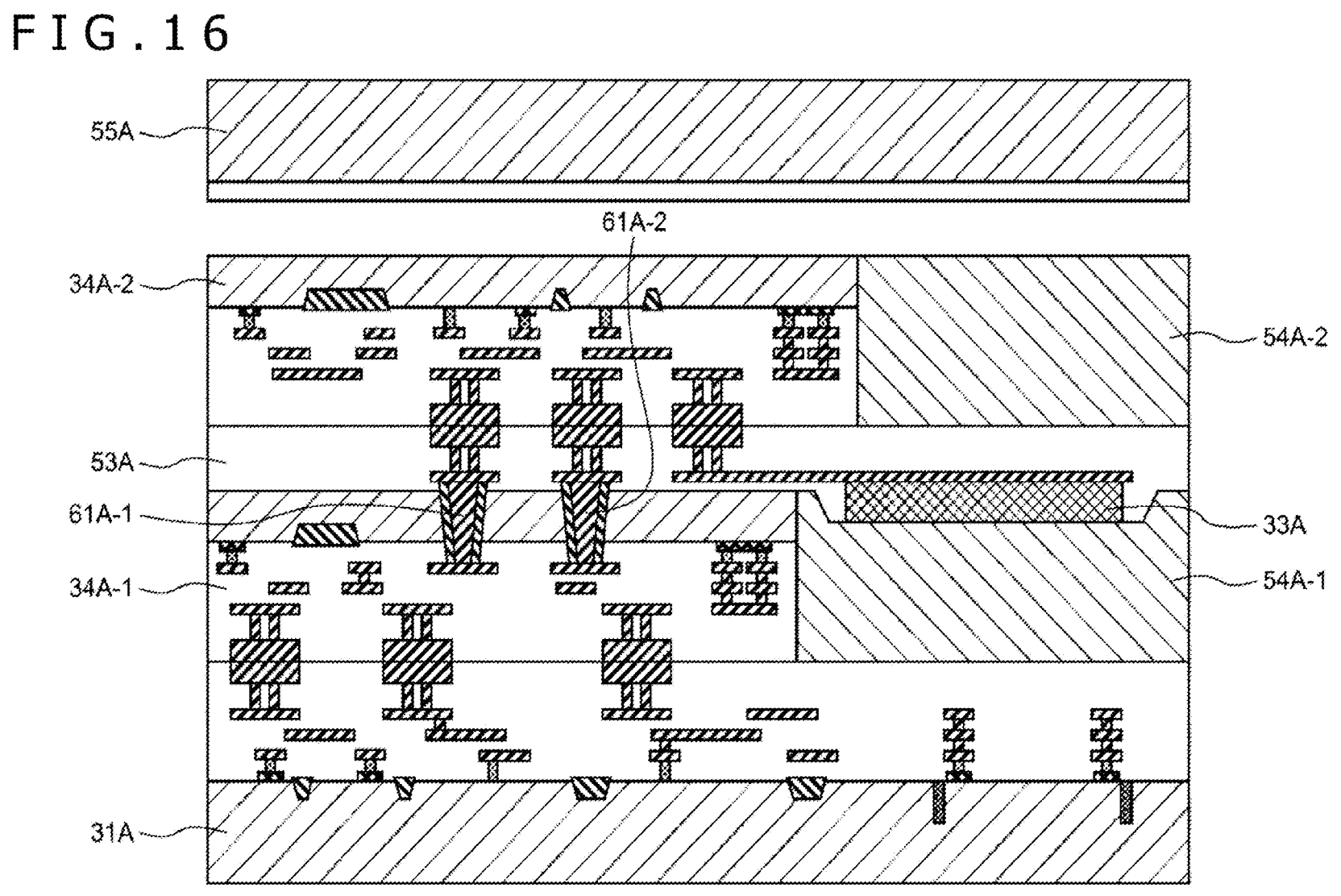

As a fifth step, as depicted in FIG. 16, an embedded member 54A-2 is embedded in such a manner as to surround the Logic substrate 34-2 at the same thickness, and further a support substrate 55A is laminated and joined on the Logic substrate 34-2 and the embedded member 54A-2.

Figure 17:
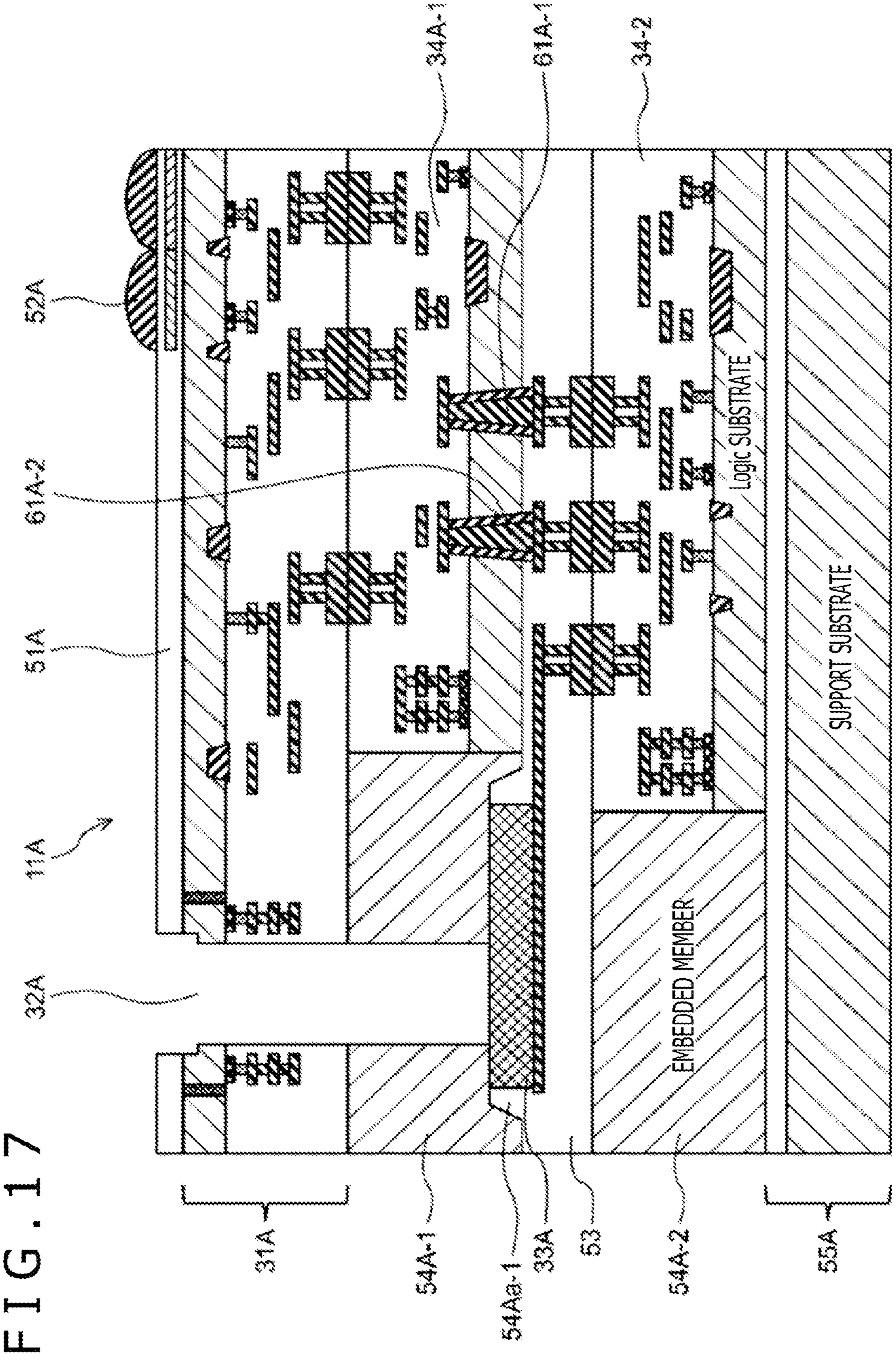
FIG. 17 is a diagram for describing a sixth step of the manufacturing method of the solid-state imaging apparatus illustrated in FIG. 11.

As a sixth step, as depicted in FIG. 17, the top and bottom of the configuration depicted in FIG. 16 are reversed, a photoelectric conversion layer 31Aa of the image sensor 31A is thinned, and an on-chip filter 51A and an on-chip lens 52A are laminated on the image sensor 31A.

Then, the rectangular through hole 32A, which is smaller than the PAD electrode 33 when viewed from the top, is formed at a position corresponding to the PAD electrode 33A in such a manner as to penetrate the on-chip filter 51A, the image sensor 31A, and the embedded member 54A-2, and the solid-state imaging element 11A is completed.

3. First Application of Second Embodiment

An example of the solid-state imaging element 11A in which the two Logic substrates 34A-1 and 34A-2 are laminated in the same direction in such a manner that the silicon layers 34Aa-1 and 34Aa-2 are located on the image sensor 31A side and the wiring layers 34Ab-1 and 34Ab-2 are located on the support substrate 55A side has been described above.

However, the silicon layers and the wiring layers of the two Logic substrates need not be laminated in the same direction.

Figure 18:
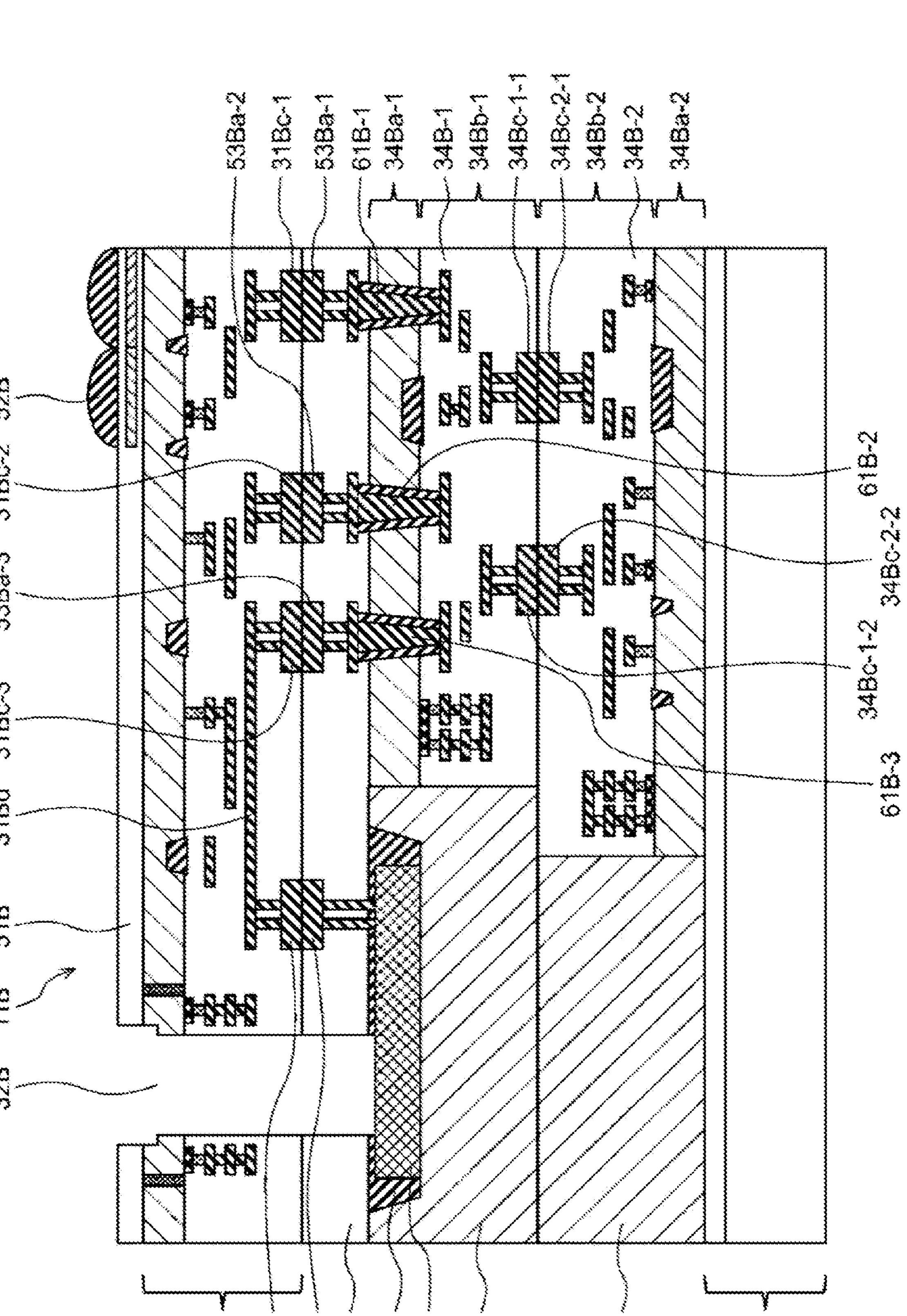
FIG. 18 is a cross-sectional view of a first application of the solid-state imaging apparatus according to the second embodiment of the present disclosure.

FIG. 18 depicts a configuration example of a solid-state imaging element in which the silicon layers and the wiring layers of the two Logic substrates are laminated in a state where the top and bottom thereof are reversed.

It should be noted that, in a solid-state imaging element 11B of FIG. 18, configurations having functions corresponding to those of the configurations in the solid-state imaging element 11A of FIG. 11 are indicated by adding "B" to the reference signs, and the descriptions thereof will be omitted as appropriate.

In the solid-state imaging element 11B of FIG. 18, for a Logic substrate 34B-1, a silicon layer 34Ba-1 is depicted at an upper part in the drawing while a wiring layer 34Bb-1 is depicted at a lower part, and the top and bottom of the silicon layer 34Aa-1 and the wiring layer 34Ab-1 of the Logic substrate 34A-1 in the corresponding FIG. 11 are reversed.

In addition, although the oxide film 53A of FIG. 11 corresponding to an oxide film 53B is formed between the Logic substrates 34A-1 and 34A-2, the oxide film 53B is formed between an image sensor 31B and the Logic substrate 34B-1.

Further, in FIG. 18, the terminals 34Ac-2-1 and 34Ac-2-2 of a Logic substrate 34B-2 are formed between the Logic substrates 34B-1 and 34B-2 at positions facing terminals 34Bc-1-1 and 34Bc-1-2 of the Logic substrate 34B-2, and are connected by CuCu junction.

In addition, in the solid-state imaging element 11B, terminals 31Bc-1 to 31Bc-4 of the image sensor 31B, which are provided at positions opposite to terminals 53Ba-1 to 53Ba-4 of the oxide film 53B, are connected to each other by CuCu junction.

Further, terminals 53Ba-2 to 53Ba-4 and terminals 31Bc-2 to 31Bc-4, which are CuCu joined to each other, are connected to through electrodes 61B-1 to 61B-3 penetrating the silicon layer 34Ba-1 of the Logic substrate 34B-1, and thus, the Logic substrates 34B-1 and 34B-2 are electrically connected to each other.

In addition, terminals 31Bc-3 and 31Bc-4 of the image sensor 31B are connected via a wiring 31Bd in the image sensor 31B. In addition, the terminal 31Bc-4 is CuCu joined to the terminal 53Ba-4 of the oxide film 53B, and further the terminal 53Ba-4 is connected to a PAD electrode 33B. Accordingly, the Logic substrate 34B-1 is electrically connected to the PAD electrode 33B via the image sensor 31B.

Further, the PAD electrode 33B is formed in a trench 54Ba-1 that is formed in an embedded member 54B-1 of the Logic substrate 34B-1 and that is recessed downward in the drawing.

In addition, the image sensor 31B corresponding to the PAD electrode 33B and a through hole 32B penetrating the oxide film 53B are formed.

With such a configuration, even in the solid-state imaging element 11B of FIG. 18, various kinds of effects that occur when the PAD electrode 33 is formed can be reduced as similar to the solid-state imaging element 11 of FIG. 1 and FIG. 2.

It should be noted that the manufacturing method of the solid-state imaging element 11B is basically similar to that of the solid-state imaging element 11A, and thus the description thereof is omitted.

4. Second Application of Second Embodiment

An example of the solid-state imaging element 11B in which the two Logic substrates 34B-1 and 34B-2 are sandwiched and laminated between the image sensor 31B and the support substrate 55B has been described above.

However, the support substrate may be omitted in such a manner that the Logic substrate that is not in contact with the image sensor 31 has the same size as the image sensor 31 and has the function as the support substrate.

Figure 19:
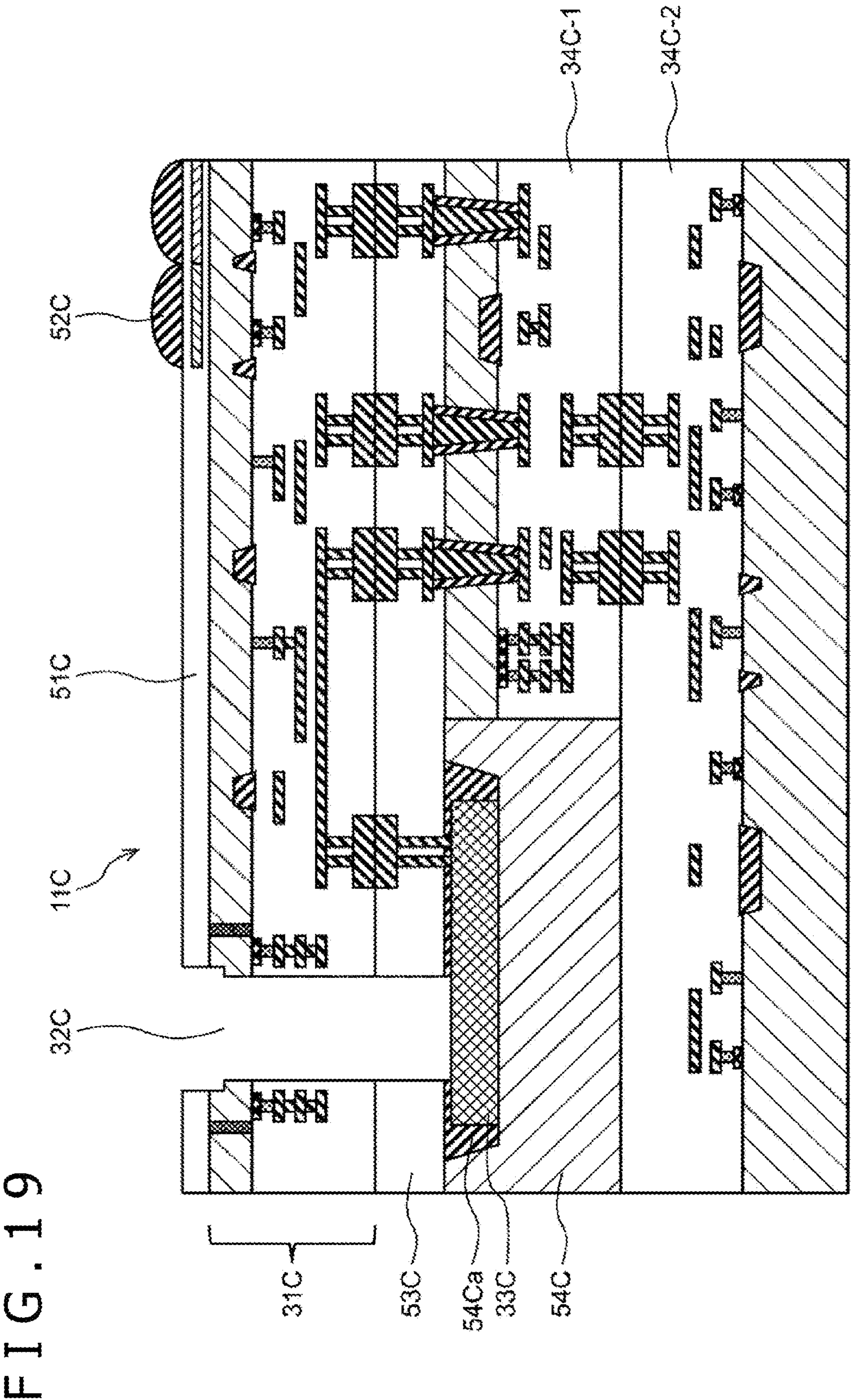
FIG. 19 is a cross-sectional view of a second application of the solid-state imaging apparatus according to the second embodiment of the present disclosure.

FIG. 19 depicts a configuration example of a solid-state imaging element in which two Logic substrates and an image sensor are laminated and the support substrate is omitted.

It should be noted that, in a solid-state imaging element 11C of FIG. 19, configurations having functions corresponding to those of the configurations in the solid-state imaging element 11B of FIG. 18 are indicated by adding "C" to the reference signs, and the descriptions thereof will be omitted as appropriate.

The difference between the solid-state imaging element 11C of FIG. 19 and the solid-state imaging element 11B of FIG. 18 is that a Logic substrate 34C-2 corresponding to the Logic substrate 34B-2 has the same size as an image sensor 31C, and the configuration corresponding to the support substrate 55B is omitted.

That is, allowing the Logic substrate 34C-2 to have the same size as the image sensor 31 by the configuration as depicted in the solid-state imaging element 11C of FIG. 19 makes it possible for the Logic substrate 34C-2 to have a function as the support substrate, thus enabling a configuration having three layers of a layer including the image sensor 31C, a layer including a Logic substrate 34C-1 and an embedded member 54C, and a layer including a Logic substrate 34C-2.

It should be noted that the manufacturing method of the solid-state imaging element 11C is basically similar to that of the solid-state imaging element 11A and only the step of laminating the support substrate is omitted, and hence, the description thereof is omitted.

With such a configuration, even in the solid-state imaging element 11C of FIG. 19, various kinds of effects that occur when the PAD electrode 33 is formed can be reduced as in the solid-state imaging element 11 of FIG. 1 and FIG. 2.

Further, since the step of laminating the support substrate is not required, it becomes possible to reduce the cost by simplifying the manufacturing step, and at the same time, it becomes possible to reduce the thickness by omitting the support substrate.

5. Third Application of Second Embodiment

A configuration example of the solid-state imaging element in which the two Logic substrates and the image sensor are laminated to form the through hole from the imaging surface side of the image sensor and direct wire bonding to the PAD electrode provided inside the embedded member is enabled has been described above.

However, it is also possible to have a configuration in which a through hole is provided on the rear surface side with respect to the imaging surface of the image sensor and a rear surface electrode is provided.

Figure 20:
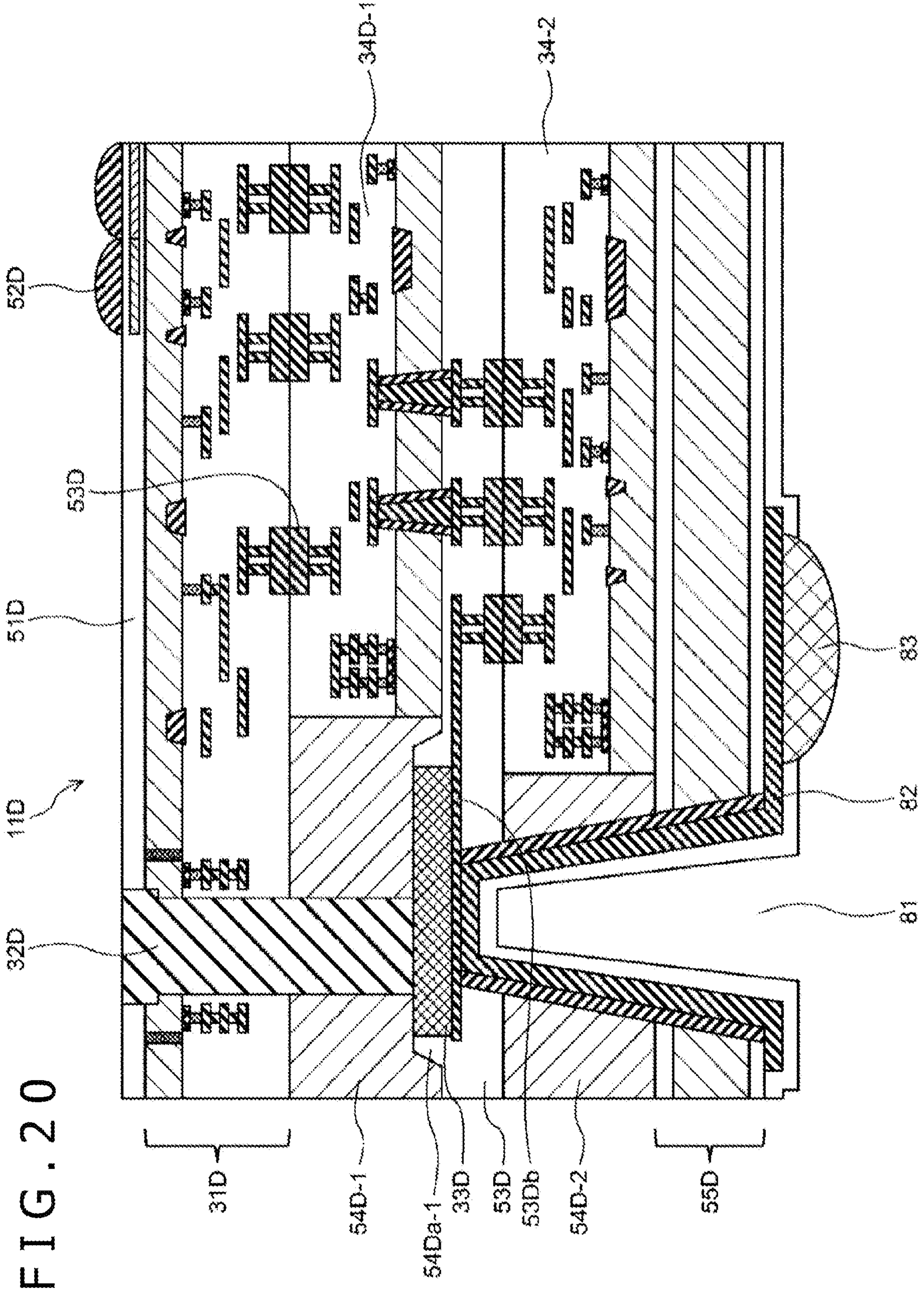
FIG. 20 is a cross-sectional view of a third application of the solid-state imaging apparatus according to the second embodiment of the present disclosure.

FIG. 20 depicts a configuration example of a solid-state imaging element in which two Logic substrates and an image sensor are laminated, a through hole is provided on the rear surface side with respect to the imaging surface of the image sensor, and a rear surface electrode is provided.

It should be noted that, in a solid-state imaging element 11D of FIG. 20, configurations having functions corresponding to those of the configurations in the solid-state imaging element 11A of FIG. 11 are indicated by adding "D" to the reference signs, and the descriptions thereof will be omitted as appropriate.

The difference between the solid-state imaging element 11D of FIG. 20 and the solid-state imaging element 11A of FIG. 11 is that a through hole 81 penetrating a support substrate 55D and an embedded member 54D-2 is formed at a position corresponding to a PAD electrode 33D when viewed from the rear surface side with respect to the imaging surface of an image sensor 31D.

In addition, wiring 82 connected to wiring 53Db in an oxide film 53D connected to the PAD electrode 33 is formed in the inner surface of the through hole 81.

Further, a rear surface electrode 83 connected to the wiring 82 is formed on the rear surface side of the solid-state imaging element 11D.

In addition, an insulating material is embedded into a through hole 32D on the image sensor 31 side, and wire bonding is not enabled from the imaging surface side.

With such a configuration, it becomes possible to connect the wiring substrate to the rear surface side. At this time, since no wiring is formed inside the Logic substrate 34-2 and the image sensor 31, unnecessary parasitic capacitance can be suppressed.

6. Third Embodiment

An example in which one image sensor, one Logic substrate, one support substrate, and the like are configured in the respective layers has been described above, but a configuration in which, for example, a plurality of Logic substrates are arranged in the same layer may be employed.

Figure 21:
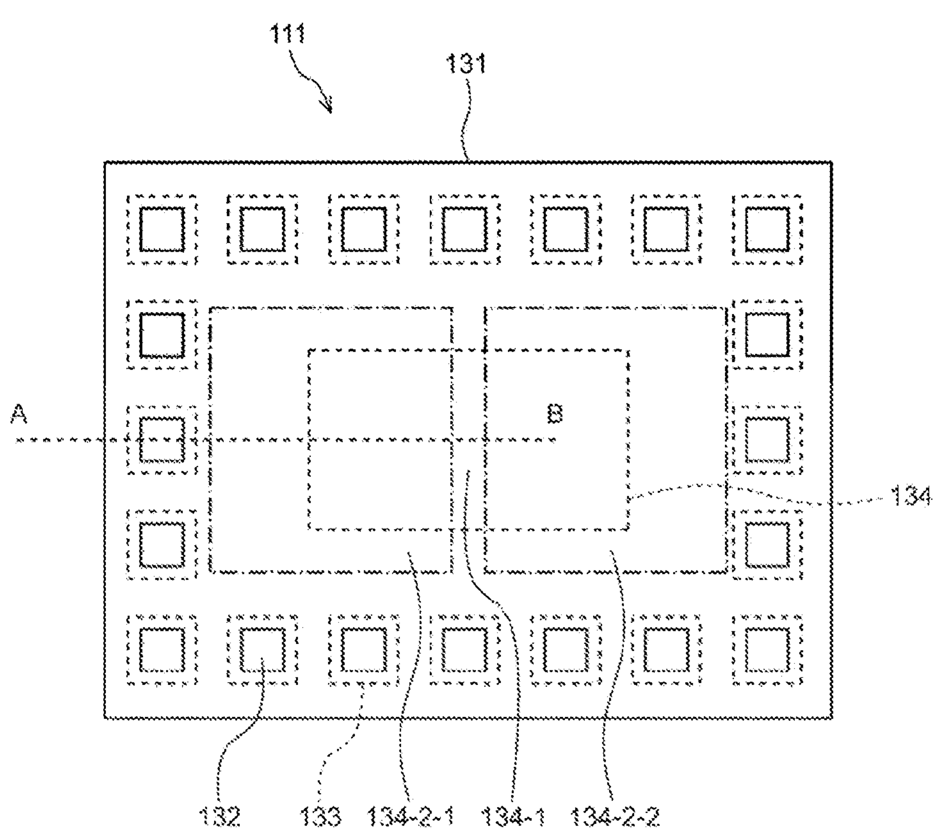
FIG. 21 is a top view of a configuration example of a solid-state imaging apparatus according to a third embodiment of the present disclosure.
Figure 22:
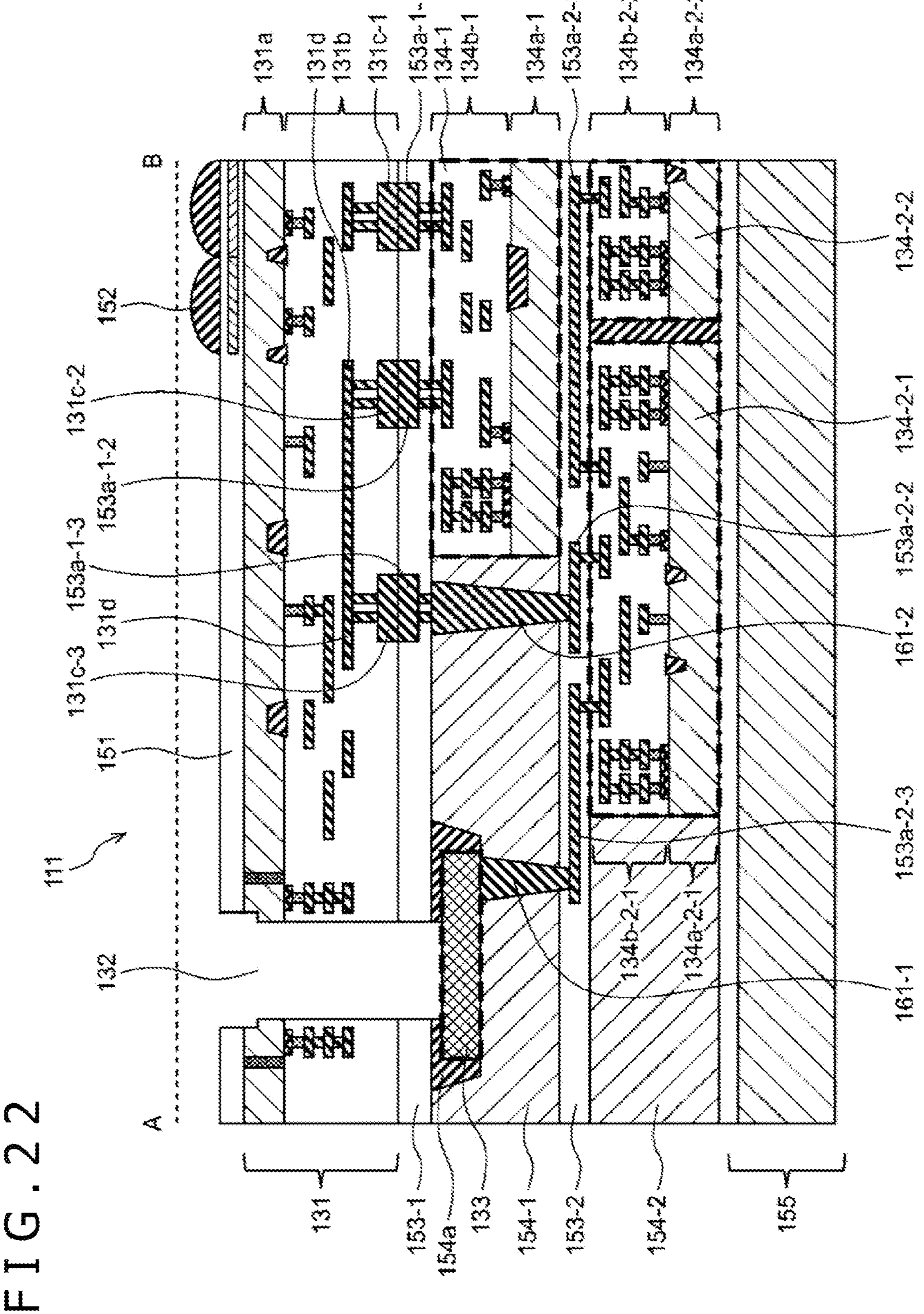
FIG. 22 is an AB cross-sectional view of FIG. 21.

FIG. 21 and FIG. 22 depict a configuration example of a solid-state imaging element according to a third embodiment in which a plurality of logic substrates are arranged in the same layer.

FIG. 21 depicts a top view when viewing a solid-state imaging element 111 from the incident direction of incident light, and FIG. 22 is an AB cross-sectional view of the solid-state imaging element 111 of FIG. 21.

As depicted in FIG. 21, in the solid-state imaging element 111, a layer including a support substrate 155, a layer including Logic substrates 134-2-1 and 134-2-2 and an embedded member 154-2, a layer including an oxide film 153-2, a layer including a Logic substrate 134-1 and an embedded member 154-1, a layer including an oxide film 153-1, and a layer including an image sensor 131 are laminated from the bottom in this order.

The image sensor 311 includes a photoelectric conversion layer 131*a* and a wiring layer 131*b*, and in the wiring layer 131*b*, three terminals 131*c*-1 to 131*c*-3 that are electrically CuCu joined are formed at positions facing three terminals 153*a*-1-1 to 153*a*-1-3 formed in the oxide film 153-1, respectively.

In addition, on the upper surface of the image sensor 131, an on-chip filter 151 for allowing incident light corresponding to the wavelength of RGB to transmit therethrough and an on-chip lens 152 for collecting the incident light in the photoelectric conversion layer 131*a* are formed from the lower side.

The Logic substrates 134-2-1 and 134-2-2, which have been confirmed to be electrically good ones, are selected and laminated on the support substrate 155, and at this time, silicon layers 134*a*-2-1 and 134*a*-2-2 are depicted at a lower part in the drawing, and wiring layers 134*b*-2-1 and 134*b*-2-2 are depicted at an upper part.

As depicted in FIG. 21, each of the Logic substrates 134-2-1 and 134-2-2 has a smaller rectangular configuration than both the image sensor 131 and the logic substrate 134-1 when viewed from the top, so that an embedded member 154-2 is embedded in a range including a part between the Logic substrates 134-2-1 and 134-2-2 and surrounding both of them.

The Logic substrate 134-1, which has been confirmed to be an electrically good one, is selected and laminated across the Logic substrates 134-2-1 and 134-2-2, and at this time, a silicon layer 134*a*-1 is depicted at a lower part in the drawing, and a wiring layer 134*b*-1 is depicted at an upper part.

As depicted in FIG. 21, the Logic substrate 134-1 has a smaller rectangular configuration than the image sensor 131 when viewed from the top, so that the embedded member 154-1 is embedded in a range surrounding the Logic substrate 134-1.

Further, as depicted in FIG. 21 and FIG. 22, rectangular and recessed trenches 154*a* are formed at predetermined intervals in the embedded member 154-1 in such a manner as to surround the Logic substrate 134-1, and further, rectangular PAD electrodes 133 are formed in the respective trenches 154*a*.

In addition, the oxide film 153-1 is provided with the terminals 153*a*-1-1 to 153*a*-1-3 connected to the terminals 131*c*-1 to 131*c*-3 of the image sensor 131 by CuCu junction, respectively, and in FIG. 21, the terminals 131*c*-1 to 131*c*-3 and the terminals 153*a*-1-1 to 153*a*-1-3 are provided at positions opposite to each other and are CuCu joined to each other.

Among them, the two terminals 131*c*-2 and 131*c*-3 on the left side in FIG. 22 are connected by wiring 131*d* in the wiring layer 131*b* of the image sensor 131.

Further, the terminal 131*c*-3 and the terminal 153*a*-1-3 on the left side in FIG. 22 are electrically connected to the Logic substrate 134-2-1 via wiring 153*a*-2-2 in the oxide film 153-2 by a through electrode 161-2 formed in the embedded member 154-1.

In addition, in the embedded member 154-1, a through electrode 161-1 that is different from the through electrode 161-2 and is electrically connected to the PAD electrode 133 is provided, and is electrically connected to the Logic substrate 134-2-1 via wiring 153*a*-2-3 in the oxide film 153-2.

Further, the Logic substrates 134-2-1 and 134-2-2 are electrically connected to each other via wiring 153*a*-2-1 in the oxide film 153.

In addition, as depicted in FIG. 21, in the image sensor 131 and the oxide film 153, a through hole 132 having a rectangular shape smaller than the PAD electrode 133 is formed on the PAD electrode 133.

Hence, an unillustrated wire which is connected to an external signal processing unit is bonded to the PAD electrode 133 by being inserted into the through hole 132.

With such a configuration, in the solid-state imaging element 111 of FIG. 21 and FIG. 22, the unillustrated wire is connected to the Logic substrate 134-2-1 via the PAD electrode 133, the through electrode 161-1, and the wiring 153*a*-2-3 of the oxide film 153-2.

In addition, the Logic substrate 134-2-1 is connected to the image sensor 131 via the through electrode 161-2 and the terminals 153*a*-1-3 and 131*c*-3. Thus, the PAD electrode 133 is also connected to the image sensor 131 via the Logic substrate 134-2-1.

Further, since the Logic substrate 134-1 is also connected to the image sensor 131, the PAD electrode 133 is also connected to the Logic 134-1 via the through electrode 161-1, the Logic substrate 134-2-1, the through electrode 161-2, and the image sensor 131.

Accordingly, the PAD electrode 133 can be formed and laid out outside the wiring layer of the Logic substrate 134-1, which is a small semiconductor element, making it possible to improve the area efficiency related to the arrangement of the PAD electrode 133.

In addition, since solder connection is performed with heating in the wire bond, if wiring or the like exists directly under the PAD electrode 133, it may be damaged due to heating.

However, as depicted in FIG. 22, since the PAD electrode 133 is formed in the trench 154*a* of the embedded member 154-1, no wiring exists directly under the PAD electrode 133, making it possible to suppress the damage to the wiring.

Further, by configuring a metal part such as aluminum that configures the PAD electrode 133 in the trench 154*a* inside the embedded member 154-1, an HDP (High Density Plasma) film is not necessary, making it possible to reduce the effects of hydrogen caused by HDP.

In addition, since the PAD electrode 133 is embedded in the embedded member 154-1, the parasitic capacitance can be reduced as compared with a case where the PAD electrode 133 is formed in a semiconductor element such as the Logic substrate 134. Further, using a material with a lower dielectric constant for the material of the embedded member 154-1 makes it possible to further reduce the parasitic capacitance that occurs in the case where the PAD electrode 133 is formed.

That is, in the solid-state imaging element 111 of the present disclosure, the configuration depicted in FIG. 21 and FIG. 22 can reduce various kinds of effects that occur when the PAD electrode 133 is formed.

<Manufacturing Method of Solid-State Imaging Element of FIG. 21 and FIG. 22>

Next, a manufacturing method of the solid-state imaging element 111 of FIG. 21 and FIG. 22 will be described with reference to FIG. 23 to FIG. 31.

As a first step, a plurality of Logic substrates 134-1 and 134-2 are formed on a wafer, thinned, and diced. Then, as depicted in FIG. 23, of the diced Logic substrates 134-1 and 134-2, good ones are selected by electrical inspection, and each is temporarily joined on rearranged substrates 201-1 and 201-2.

Figure 23:
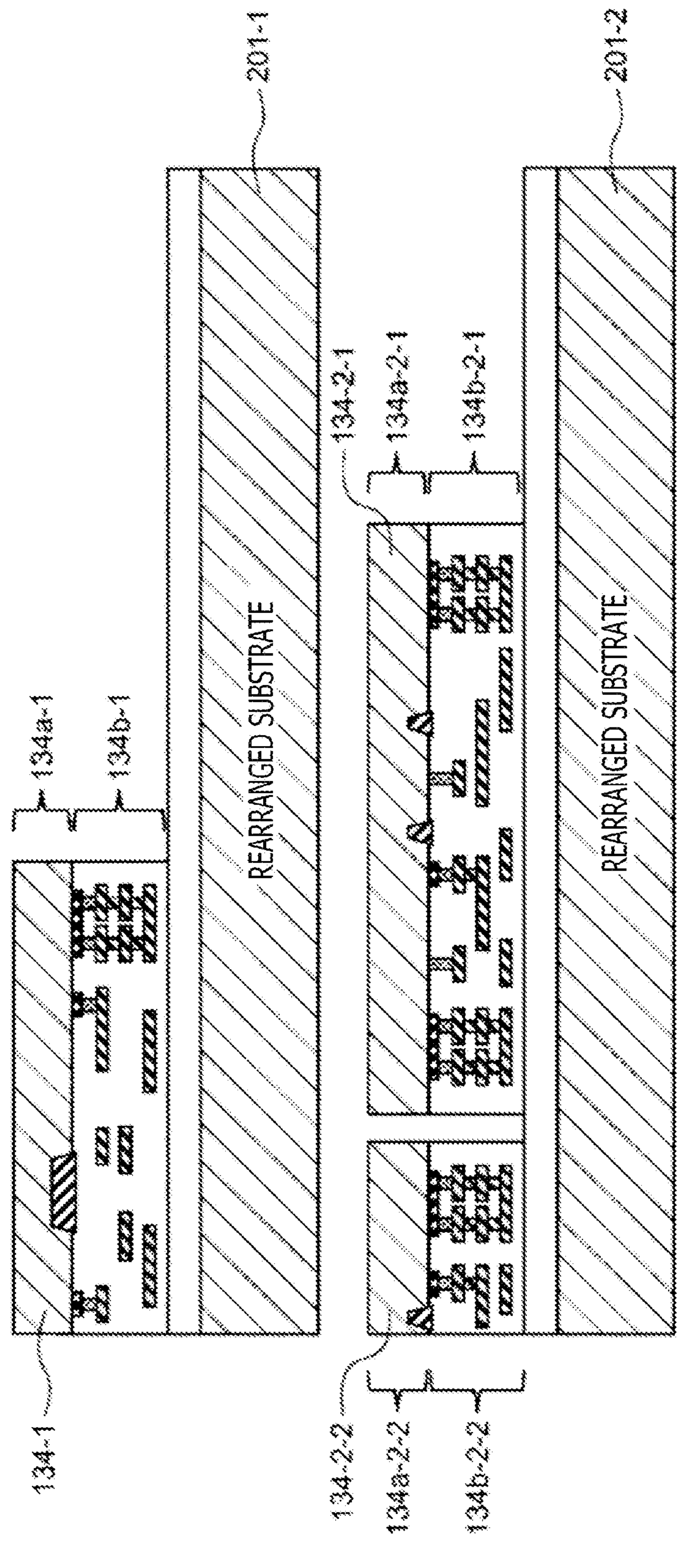
FIG. 23 is a diagram for describing a first step of a manufacturing method of the solid-state imaging apparatus illustrated in FIG. 21 and FIG. 22.

More specifically, as depicted in FIG. 23, the wiring layer 134*b*-1 of the Logic substrate 134-1 and the rearranged substrate 201-1 are temporarily joined to face each other, and the wiring layers 134*b*-2-1 and 134*b*-2-2 of the Logic substrates 134-2-1 and 134-2-2 and the rearranged substrate 201-2 are temporarily joined to face each other.

Figure 24:
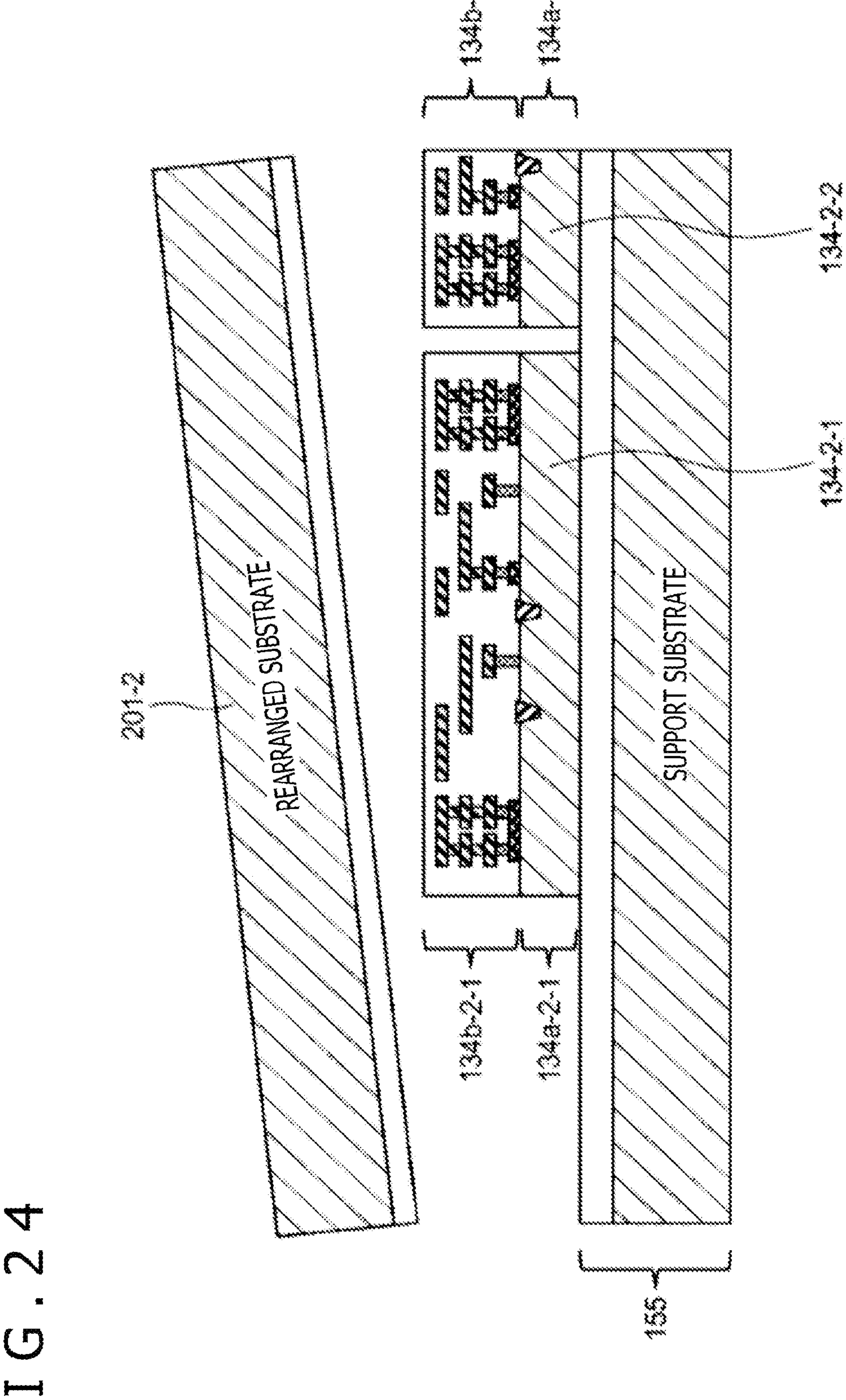
FIG. 24 is a diagram for describing a second step of the manufacturing method of the solid-state imaging apparatus illustrated in FIG. 21 and FIG. 22.

As a second step, as depicted in FIG. 24, the Logic substrates 134-2-1 and 134-2-2 temporarily joined on the rearranged substrate 201-2 are joined in such a manner that the silicon layers 134*a*-2-1 and 134*a*-2-2 are pasted in a direction facing the support substrate 155.

Figure 25:
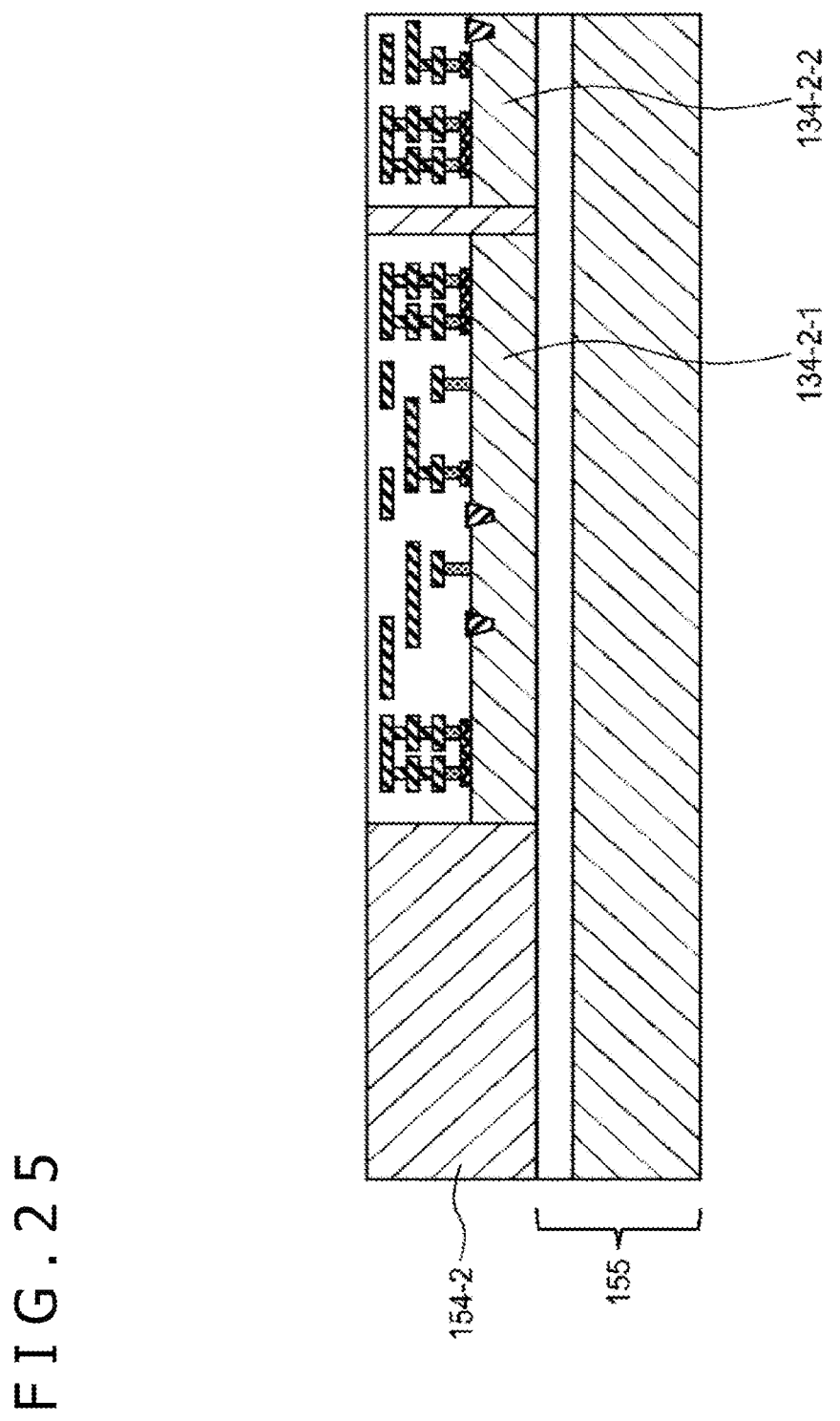

As a third step, as depicted in FIG. 25, the embedded member 154-2 is embedded at the outer periphery that includes a part between the Logic substrates 134-2-1 and 134-2-2 and that surrounds them and at the same thickness as the Logic substrates 134-2-1 and 134-2-2.

Figure 26:
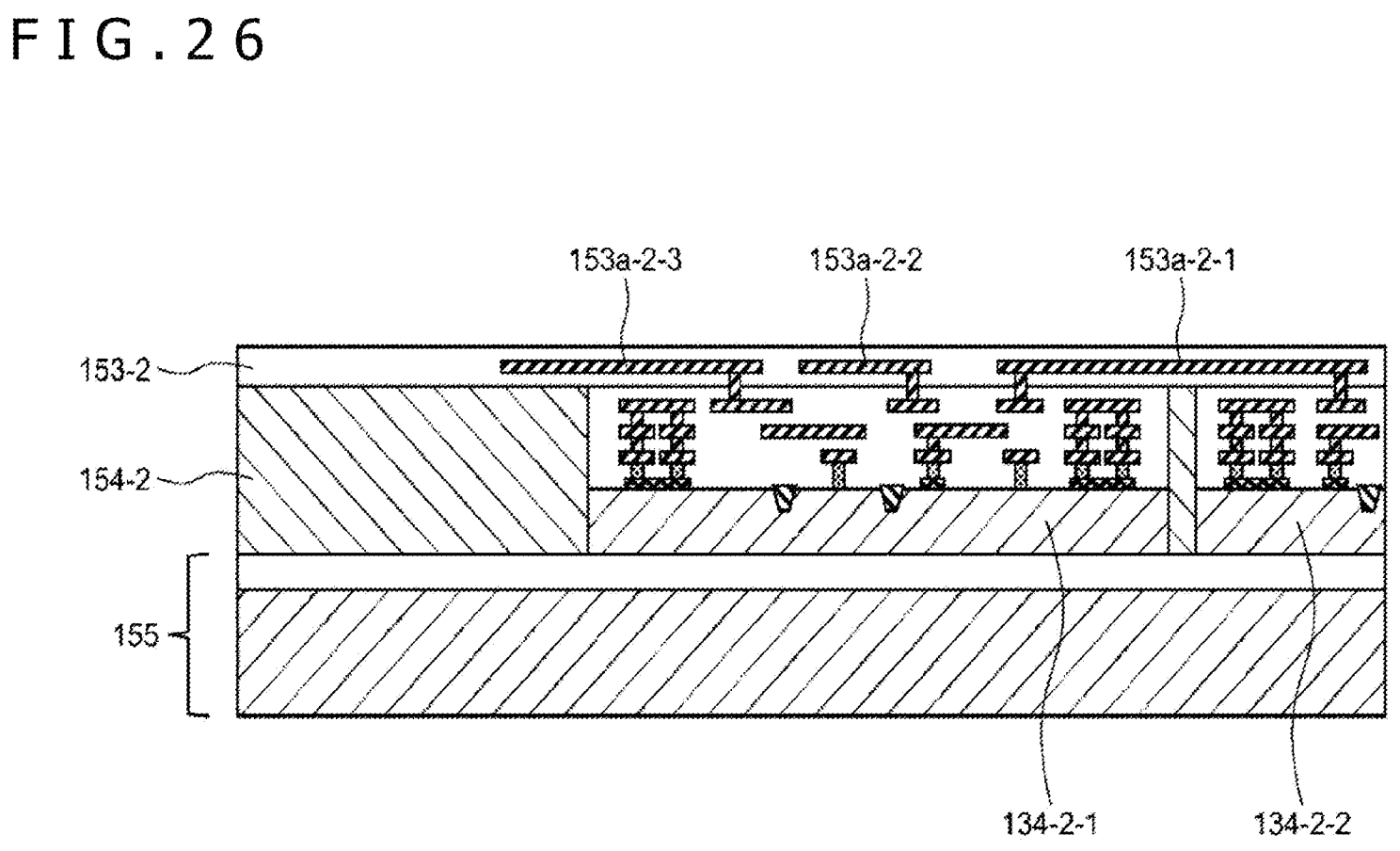

As a fourth step, as depicted in FIG. 26, the oxide film 153-2 including the wiring 153*a*-2 is formed on the Logic substrates 134-2-1 and 134-2-2 and the embedded member 154-2.

Figure 27:
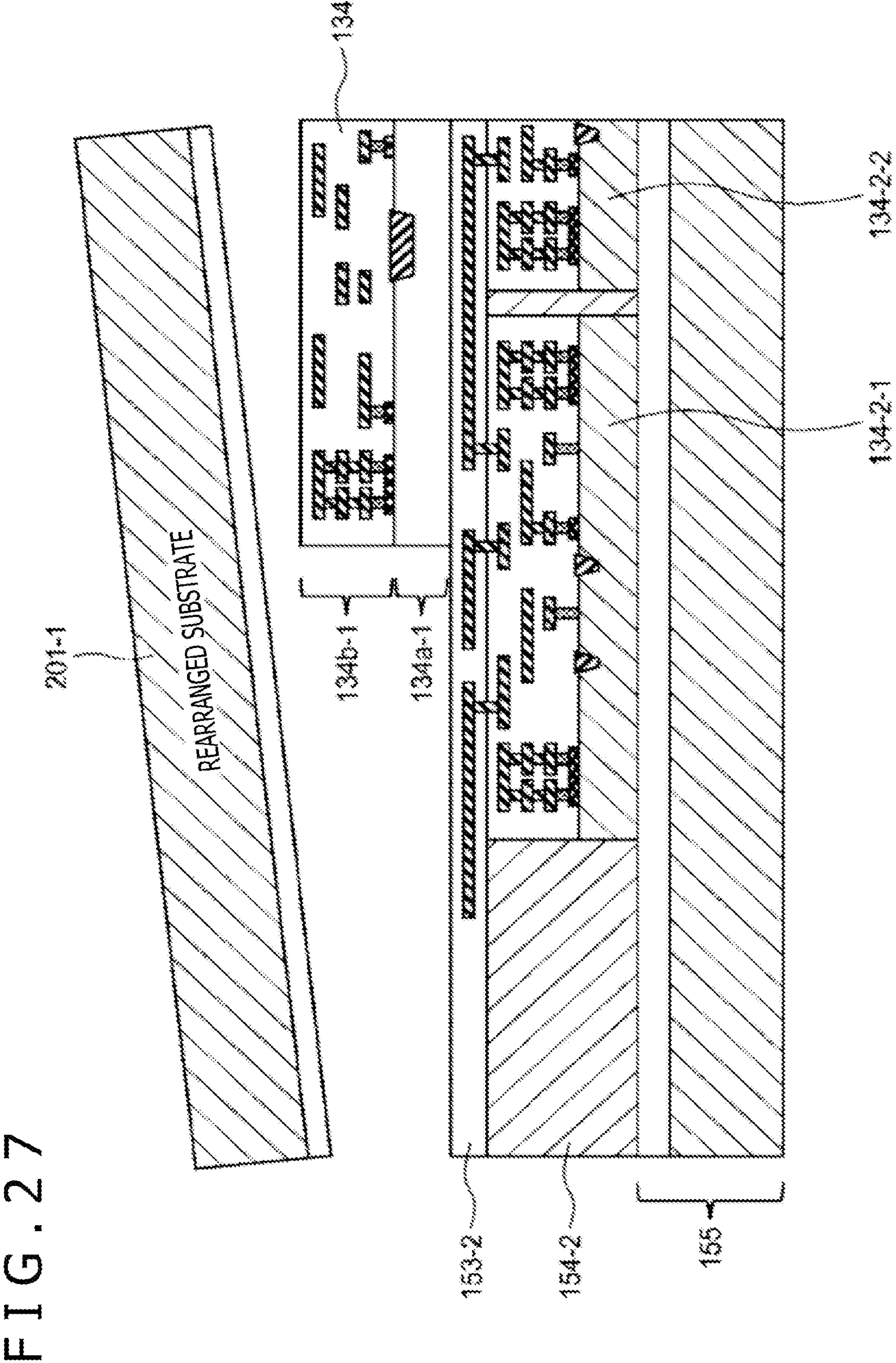
FIG. 27 is a diagram for describing a fifth step of the manufacturing method of the solid-state imaging apparatus illustrated in FIG. 21 and FIG. 22.

As a fifth step, as depicted in FIG. 27, the Logic substrate 134-1 temporarily joined on the rearranged substrate 201-1 is joined in such a manner that the silicon layer 134*a*-1 is pasted in a direction facing the oxide film 153-2.

Figure 28:
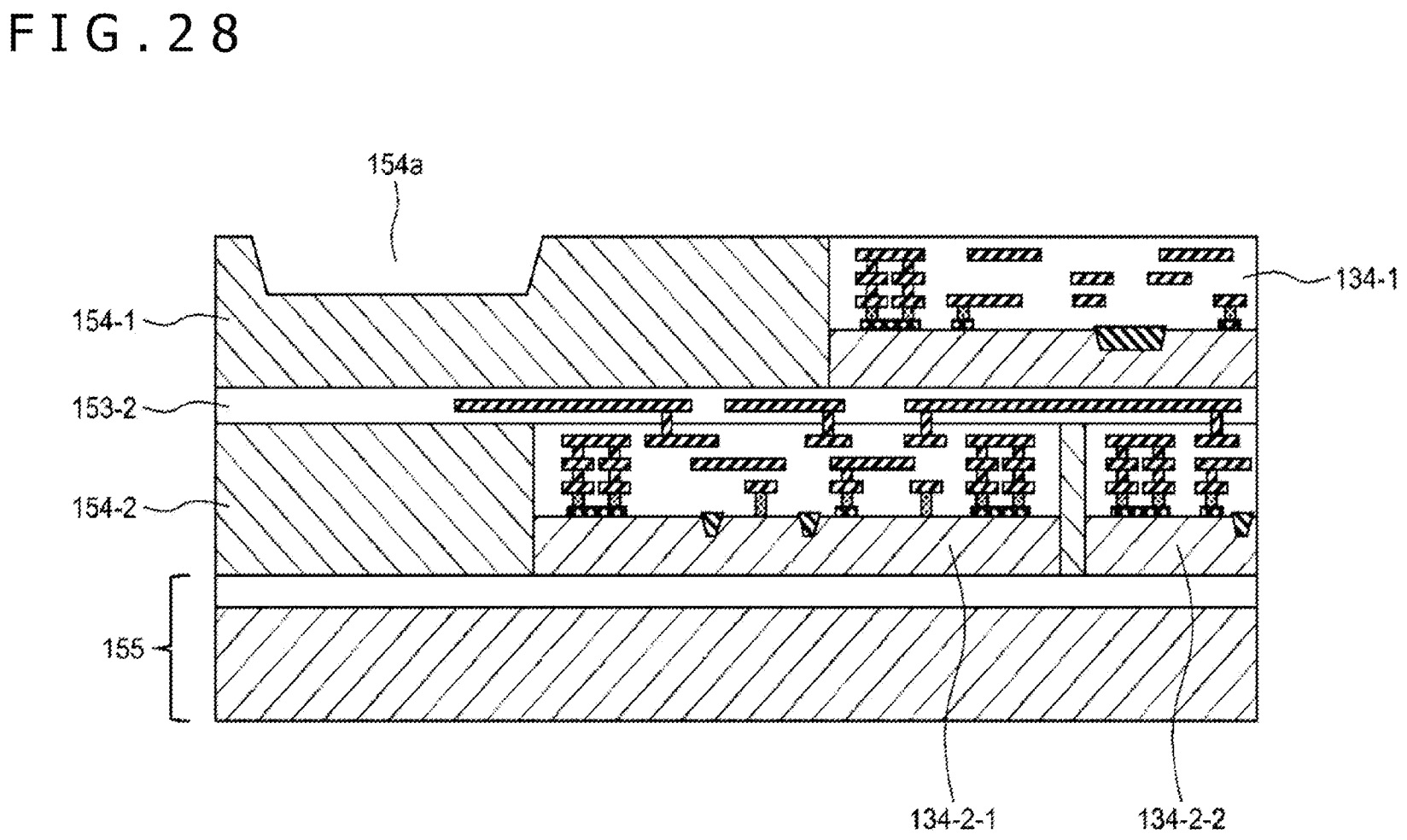

As a sixth step, as depicted in FIG. 28, the embedded member 154-1 is formed so as to surround the logic substrate 134-1, and further the trenches 154*a* that are formed in a rectangular shape when viewed from the top and in a recessed shape facing downward are formed from the side at predetermined intervals.

Figure 29:
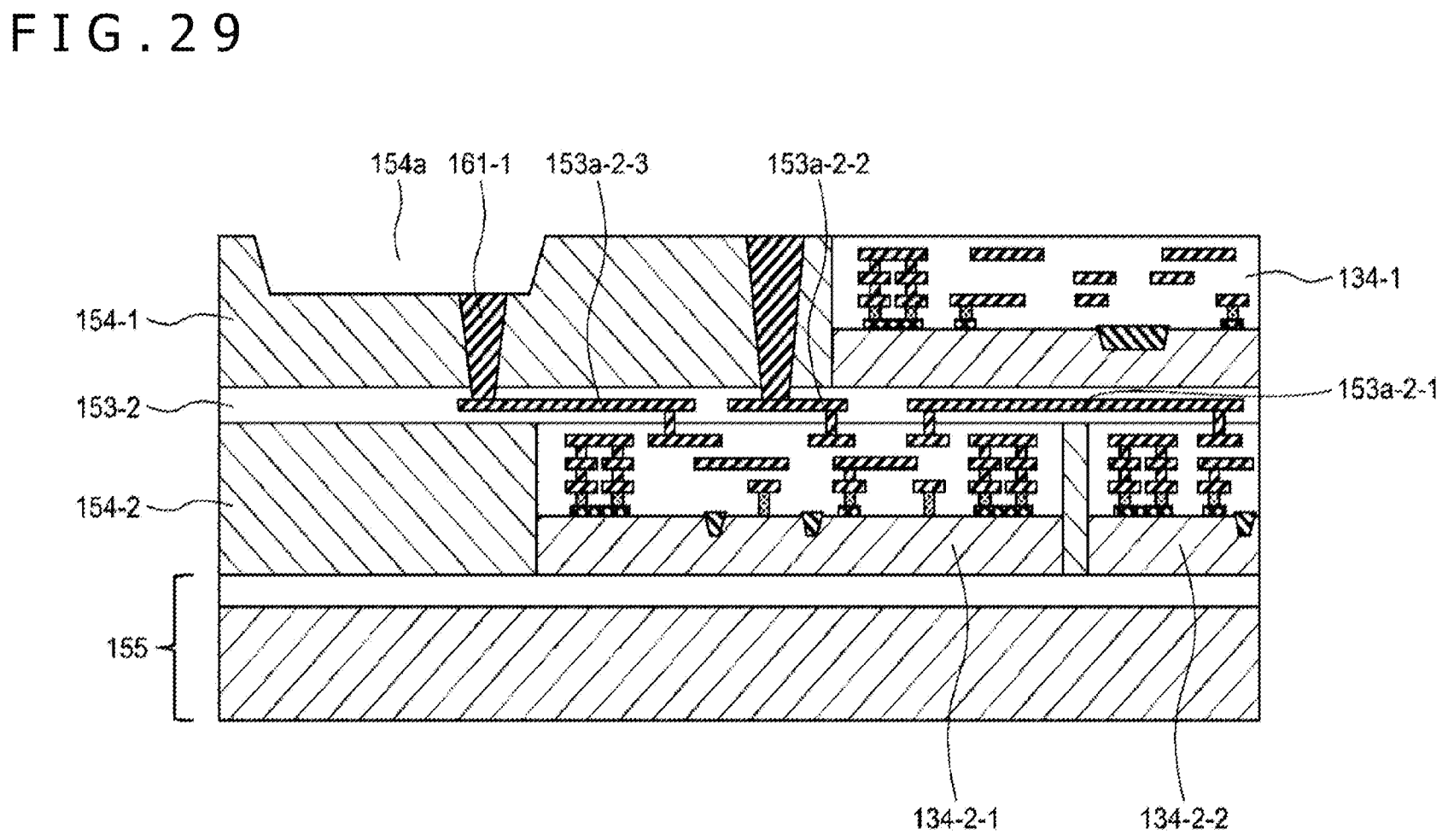

As a seventh step, as depicted in FIG. 29, the through electrodes 161-1 and 161-2 are formed in the embedded member 154-1 and connected to the wiring 153*a*-2-3 and wiring 153*a*-2-2 of the oxide film 153-2, respectively. At this time, in FIG. 28, the through electrode 161-1 is formed at a part of the trench 154*a* and connected to the wiring 153*a*-2-3 of the oxide film 153-2.

Figure 30:
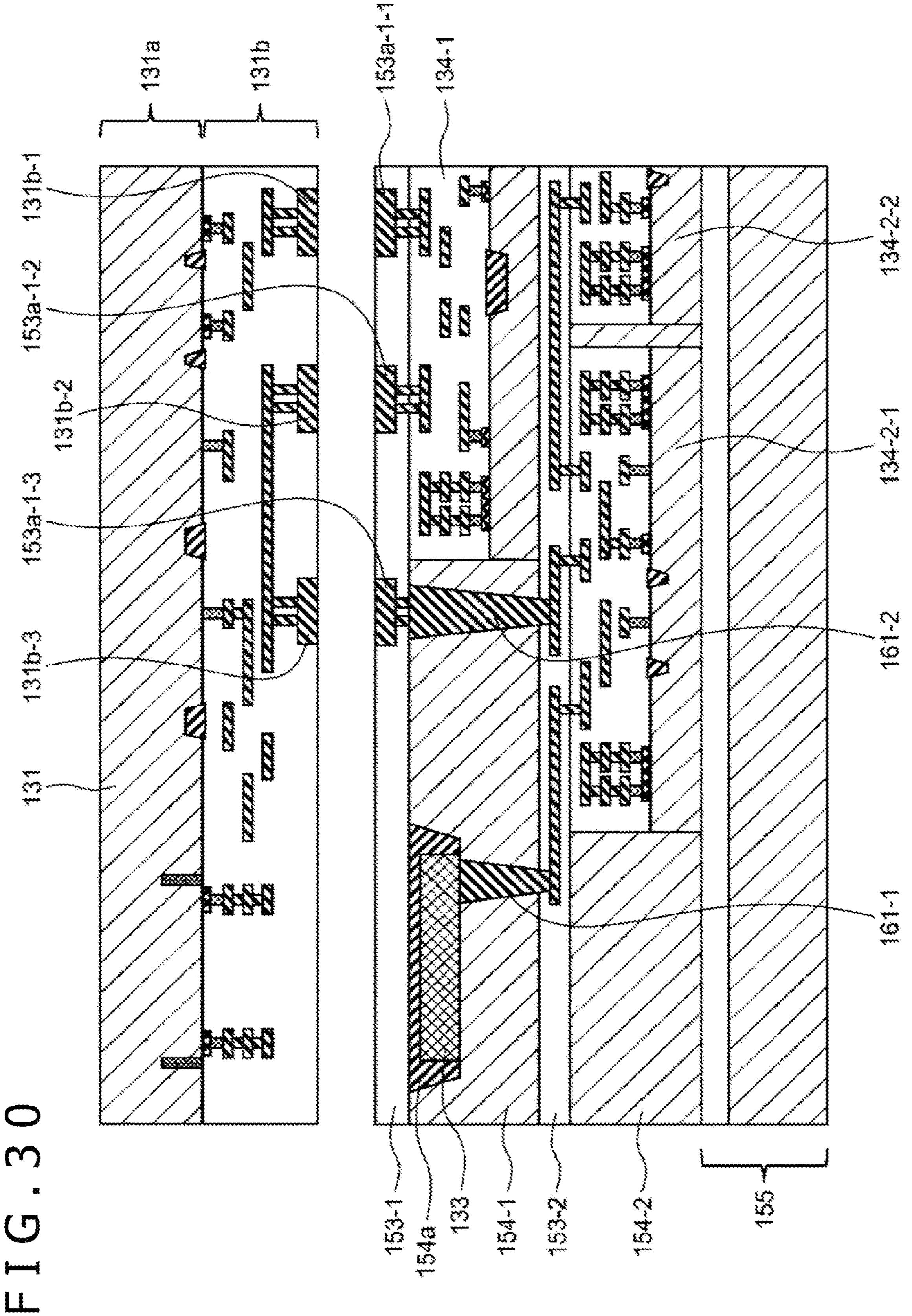
FIG. 30 is a diagram for describing an eighth step of the manufacturing method of the solid-state imaging apparatus illustrated in FIG. 21 and FIG. 22.

As an eighth step, as depicted in FIG. 30, after the PAD electrode 33 is formed in the trench 54*a*, the oxide film 153-1 including the terminals 153*a*-1-1 to 153*a*-1-3 is formed. Further, the terminals 131*c*-1 to 131*c*-3 of the wiring layer 131*b* of the image sensor 31 and the terminals 153*a*-1-1 to 153*a*-1-3 of the oxide film 153-1 are joined in a facing state.

Figure 31:
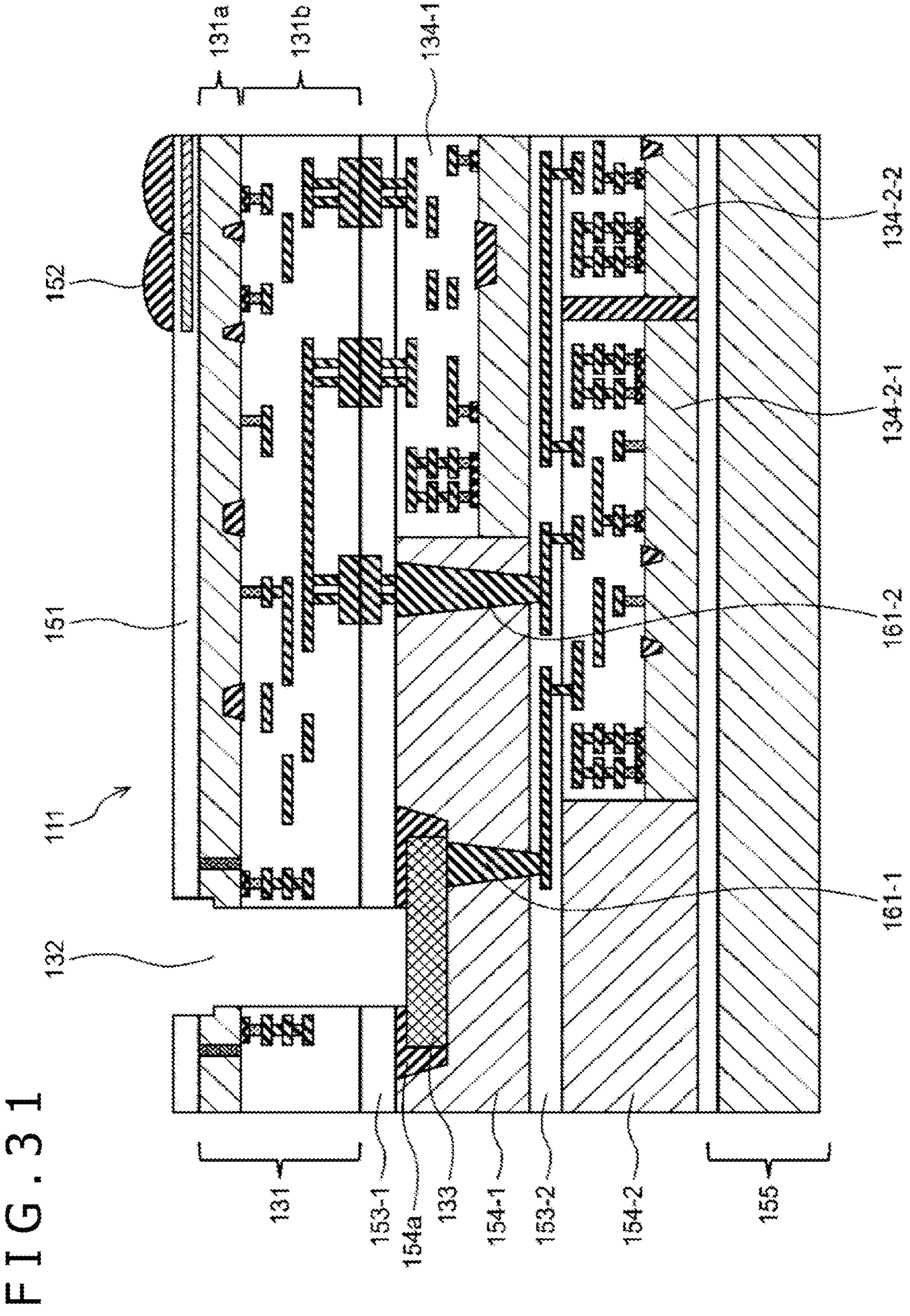
FIG. 31 is a diagram for describing a ninth step of the manufacturing method of the solid-state imaging apparatus illustrated in FIG. 21 and FIG. 22.

As a ninth step, as depicted in FIG. 31, after the photoelectric conversion layer 131*a* of the image sensor 131 is thinned and the on-chip filter 151 and the on-chip lens 152 are laminated on the image sensor 131, the rectangular through hole 132, which is smaller than the PAD electrode 133 when viewed from the top, is formed at a position corresponding to the PAD electrode 133 in such a manner as to penetrate the image sensor 131 and the oxide film 153-1, and the solid-state imaging element 111 is completed.

7. Examples of Application to Electronic Device

The above-described solid-state imaging element can be applied to, for example, various types of electronic devices such as an imaging apparatus exemplified by a digital still camera and a digital video camera, a mobile phone including an imaging function, or other devices including an imaging function.

Figure 32:
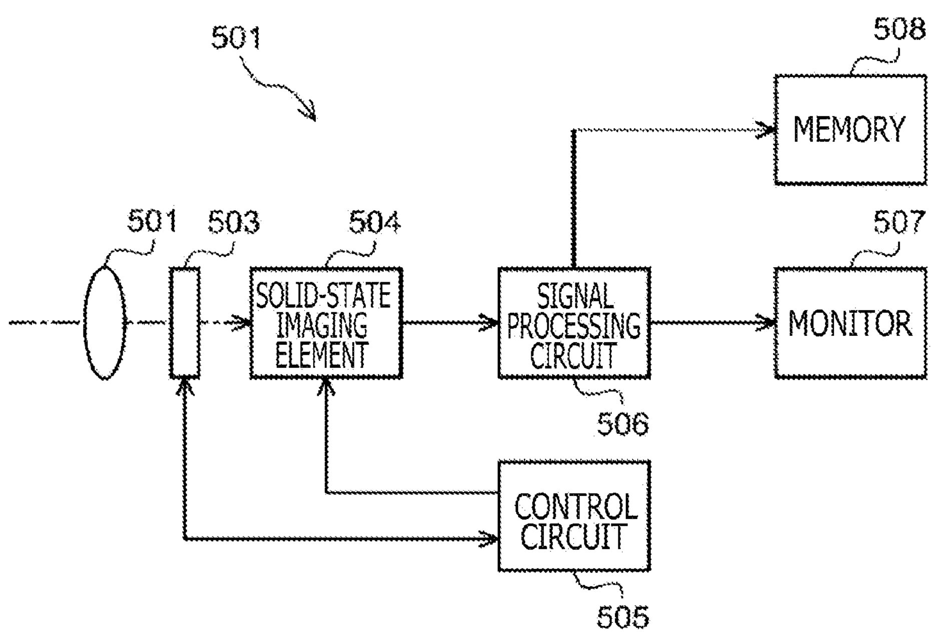
FIG. 32 is a diagram for describing an example of application to an electronic device.

FIG. 32 is a block diagram depicting a configuration example of an imaging apparatus as an electronic device to which the present technique is applied.

An imaging apparatus 501 depicted in FIG. 32 includes an optical system 502, a shutter device 503, a solid-state imaging element 504, a driving circuit 505, a signal processing circuit 506, a monitor 507, and a memory 508, and can capture still images and moving images.

The optical system 502 has one or a plurality of lenses, and introduces light (incident light) from a subject to the solid-state imaging element 504 to form an image on a light receiving surface of the solid-state imaging element 504.

The shutter device 503 is arranged between the optical system 502 and the solid-state imaging element 504, and controls a light irradiation period and a light shading period for the solid-state imaging element 504 according to the control of the driving circuit 505.

The solid-state imaging element 504 includes a package including the above-described solid-state imaging element. The solid-state imaging element 504 accumulates signal charge for a certain period of time according to the light formed on the light receiving surface via the optical system 502 and the shutter device 503. The signal charge accumulated in the solid-state imaging element 504 is transferred according to a driving signal (timing signal) supplied from the driving circuit 505.

The driving circuit 505 outputs a driving signal that controls the transfer operation of the solid-state imaging element 504 and the shutter operation of the shutter device 503 to drive the solid-state imaging element 504 and the shutter device 503.

The signal processing circuit 506 performs various kinds of signal processing on the signal charge output from the solid-state imaging element 504. An image (image data) obtained by the signal processing being performed by the signal processing circuit 506 is supplied to the monitor 507 for display or supplied to the memory 508 for storage (recording).

Even in the imaging apparatus 501 configured in such a manner, applying the above-described solid-state imaging elements 11, 11A to 11D, and 111 makes it possible to improve the area efficiency related to the arrangement of the PAD electrode. In addition, it becomes possible to suppress damage to the wiring in the wire bond. Further, by the PAD electrode being configured into the embedded member, an HDP (High Density Plasma) film is not necessary, and it becomes possible to reduce the effect of hydrogen caused by HDP. In addition, it becomes possible to reduce the parasitic capacitance generated in the wiring connected to the PAD electrode.

8. Examples of Using Solid-State Imaging Element

Figure 33:
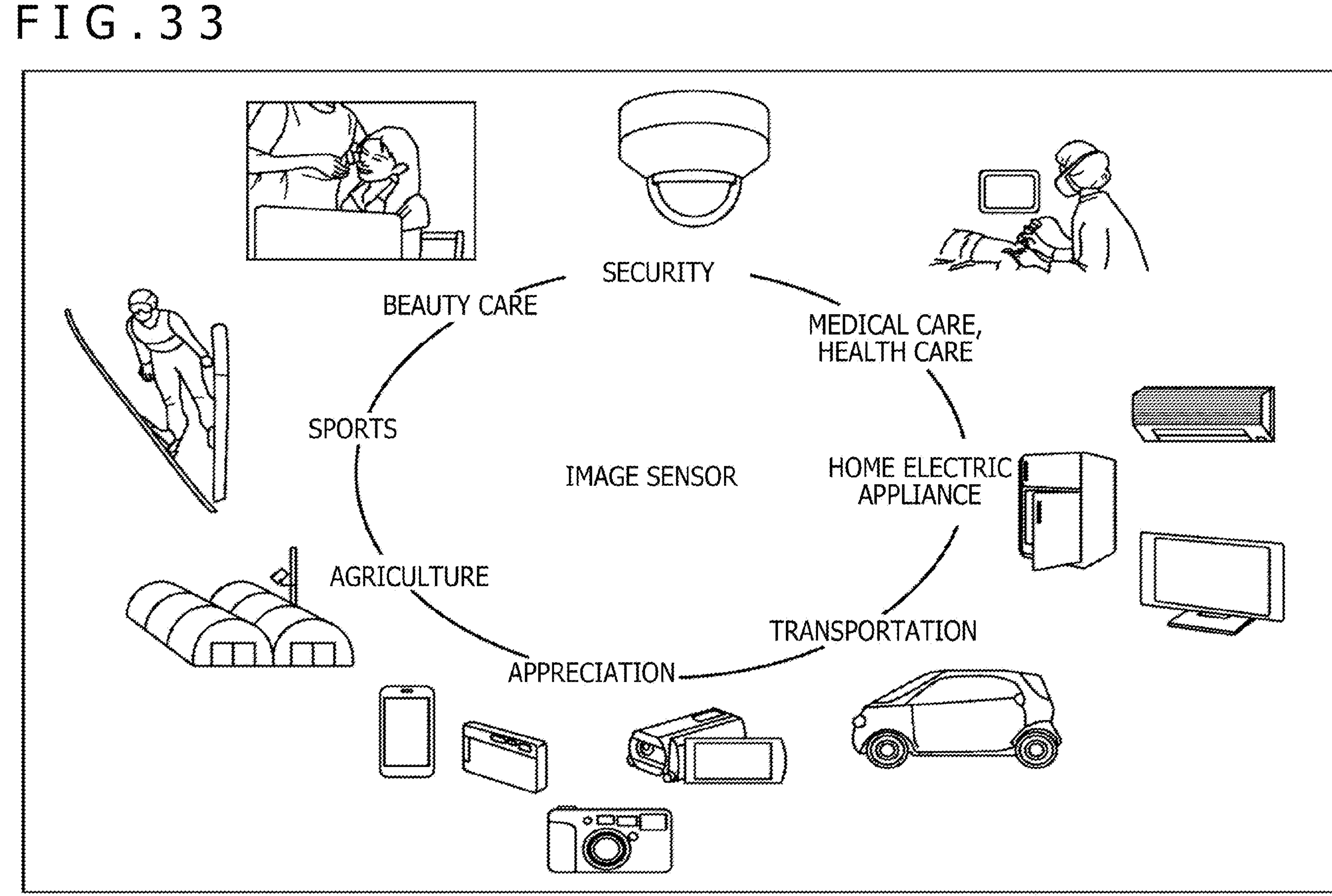
FIG. 33 is a diagram for describing an example of using the solid-state imaging element.

FIG. 33 is a diagram depicting an example of using the above-described solid-state imaging elements 11, 11A to 11D, and 111. The above-described solid-state imaging element can be used in various cases where, for example, visible light, or light such as infrared light, ultraviolet light, and X-rays is sensed as the following.

- Apparatuses that photograph images to be used for appreciation, such as digital cameras and portable devices with camera functions
- Apparatuses that are used for transportation for safe driving such as automatic stop, recognition of the state of the driver, and the like, such as on-vehicle sensors that photograph the front, rear, circumference, and inside of the automobile, monitoring cameras that monitor travelling vehicles and roads, and ranging sensors that measure the distances between vehicles
- Apparatuses that are used in home electric appliances such as TVs, refrigerators, and air conditioners in order to photograph gestures of a user and perform device operations according to the gestures
- Apparatuses that are used for medical care or health care, such as endoscopes or apparatuses that photograph a blood vessel by receiving infrared light
- Apparatuses that are used for security, such as monitoring cameras for crime prevention and cameras for person authentication
- Apparatuses that are used for beauty care, such as skin measuring apparatuses that photograph a skin or microscopes that photograph a scalp
- Apparatuses that are used for sports, such as action cameras and wearable cameras for sports uses <<9. Application to Mobile Body>>

The technique (the present technique) according to the present disclosure can be applied to various products. For example, the technique according to the present disclosure may be realized as an apparatus mounted on any type of mobile bodies such as an automobile, an electric automobile, a hybrid electric automobile, a motorcycle, a bicycle, a personal mobility, an airplane, a drone, a ship, and a robot.

Figure 34:
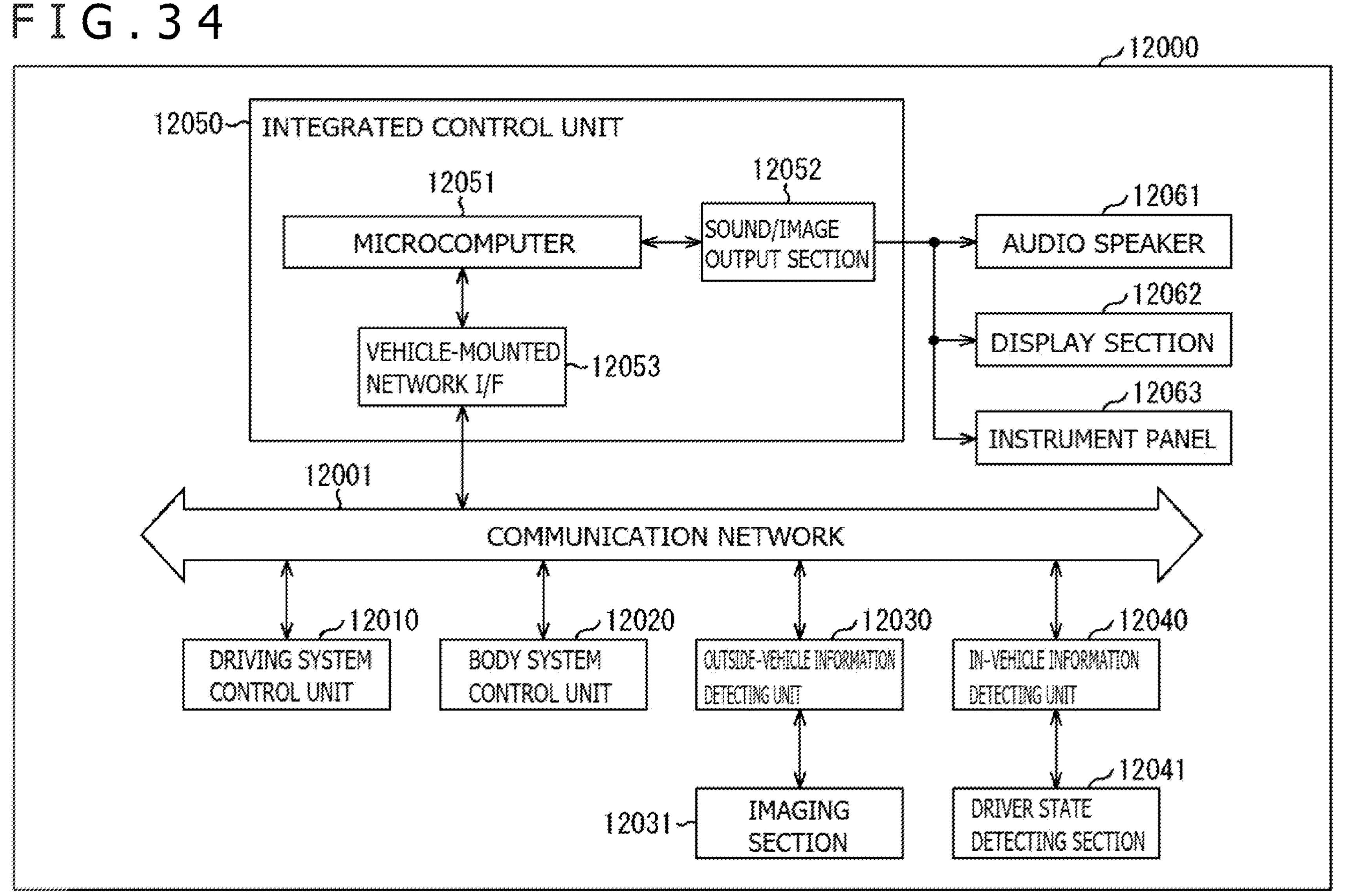
FIG. 34 is a block diagram depicting an example of schematic configuration of a vehicle control system.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

Figure 35:
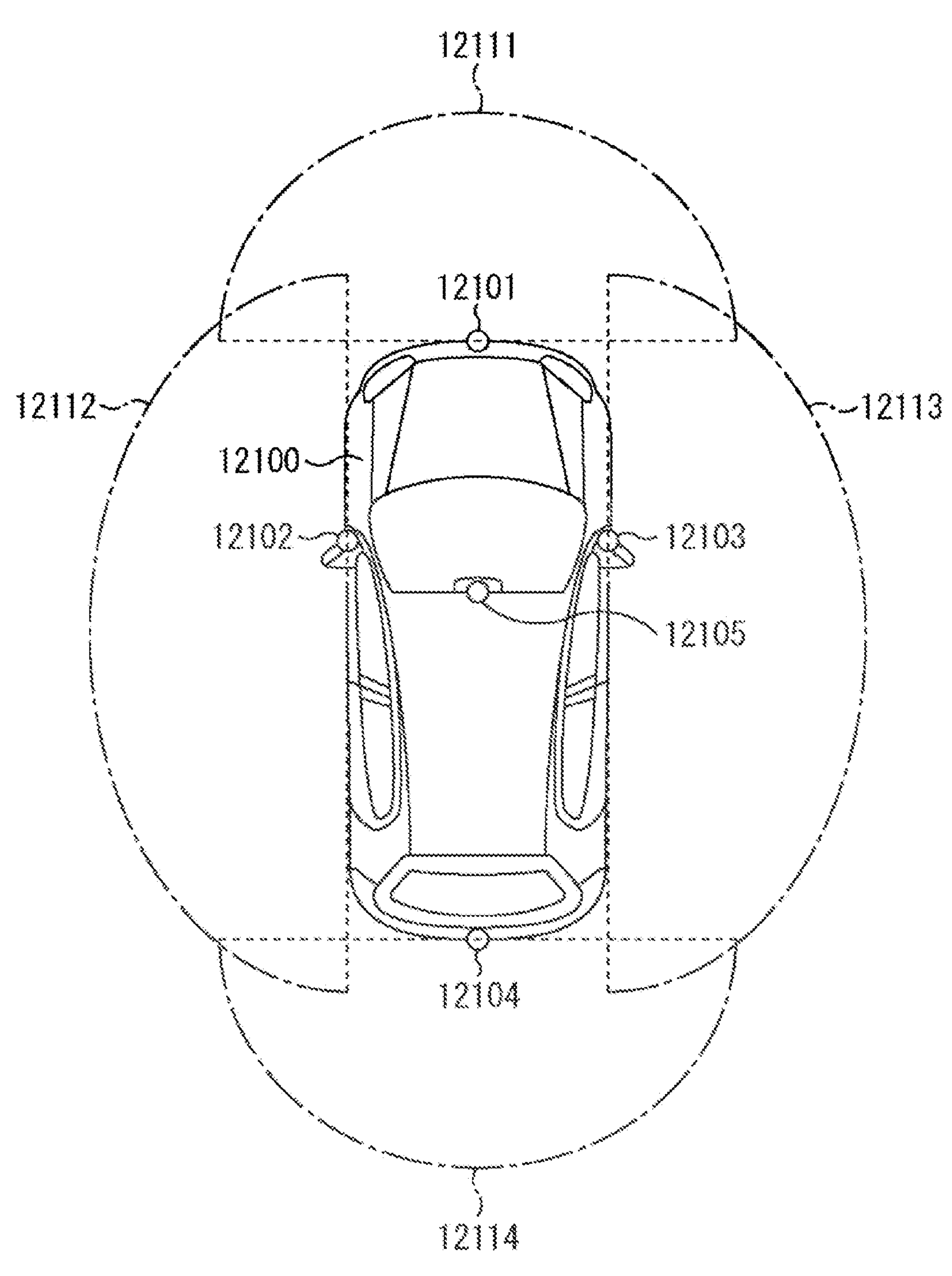
FIG. 35 is a diagram of assistance in explaining an example of installation positions of an outside-vehicle information detecting section and an imaging section.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technique according to the present disclosure can be applied has been described above. The technique according to the present disclosure can be applied to the imaging section 12031 among the configurations described above. Specifically, the solid-state imaging elements 11, 11A to 11D, and 111 can be applied to the imaging section 12031. Applying the technique according to the present disclosure to the imaging section 12031 makes it possible to improve the area efficiency related to the arrangement of the PAD electrode, to suppress damage to the wiring, to reduce the effect of hydrogen caused by HDP, and to reduce the parasitic capacitance.

It should be noted that the present disclosure can also be configured as follows.

<1>

A solid-state imaging element including:

a first semiconductor element that has an imaging element for photoelectrically converting incident light; and a second semiconductor element that is smaller than the first semiconductor element having a signal processing circuit for processing a pixel signal of the imaging element, in which a circumference of the second semiconductor element is embedded with an embedded member, and a PAD electrode is formed in the embedded member.

<2)

The solid-state imaging element according to <1>, in which a trench is formed in the embedded member, and the PAD electrode is formed in the trench.

<3>

The solid-state imaging element <1> or <2>, in which the embedded member includes a material with a low dielectric constant.

<4>

The solid-state imaging element according to any one of <1> through <3>, in which a through hole that penetrates the first semiconductor element and reaches the PAD electrode is formed directly above the PAD electrode in a direction opposite to an incident direction of the incident light.

<5>

The solid-state imaging element according to <4>, in which the through hole is formed in such a manner as to penetrate the embedded member in addition to the first semiconductor element and to reach the PAD electrode.

<6>

The solid-state imaging element according to <4>, in which a wire connected to an external signal processing apparatus is inserted into the through hole and bonded to the PAD electrode.

<7>

The solid-state imaging element according to <1>, further including:

a third semiconductor element that has a signal processing circuit for processing a pixel signal of the imaging element and is different from the second semiconductor element, in which layers each including any one of the first semiconductor element, the second semiconductor element, and the third semiconductor element are laminated in an order of the first semiconductor element, the second semiconductor element, and the third semiconductor element from an incident direction of the incident light.

<8>

The solid-state imaging element according to <7>, in which the third semiconductor element has the same size as the first semiconductor element.

<9>

The solid-state imaging element according to <7>, in which the third semiconductor element is smaller than the first semiconductor element, and, in the layer including the third semiconductor element, a circumference of the third semiconductor element is embedded with another embedded member different from the embedded member.

<10>

The solid-state imaging element according to <9>, further including:

a support substrate having the same size as the first semiconductor element, in which layers each including any one of the first semiconductor element, the second semiconductor element, the third semiconductor element, and the support substrate are laminated in the order of the first semiconductor element, the second semiconductor element, the third semiconductor element, and the support substrate from the incident direction of the incident light.

<11>

The solid-state imaging element according to <10>, in which a through hole penetrating the support substrate and the third semiconductor element is formed from a direction opposite to the incident direction of the incident light, inner wall wiring electrically connected to the PAD electrode is formed in an inner wall of the through hole, a rear surface electrode is formed near the through hole on the rear surface side of the support substrate when the incident direction of the incident light is assumed as a front surface, and the rear surface electrode is electrically connected to the PAD electrode via the inner wall wiring.

<12>

The solid-state imaging element according to <9>, in which each of the second semiconductor element and the third semiconductor element includes a silicon layer and a wiring layer, and the silicon layer and the wiring layer are laminated in the same order with respect to the incident direction of the incident light.

<13>

The solid-state imaging element according to <9>, in which each of the second semiconductor element and the third semiconductor element includes a silicon layer and a wiring layer, and the silicon layer and the wiring layer are laminated in a different order with respect to the incident direction of the incident light.

<14>

The solid-state imaging element according to <9>, in which the second semiconductor element includes a silicon layer and a wiring layer, and includes a through electrode formed by penetrating the silicon layer.

<15>

The solid-state imaging element according to <9>, in which a plurality of the third semiconductor elements are arranged in the same layer.

<16>

The solid-state imaging element according to <9>, in which a through electrode penetrating the embedded member is formed.

<17>

The solid-state imaging element according to <16>, in which the through electrode electrically connects the first semiconductor element and the third semiconductor element to each other.

<18>

The solid-state imaging element according to <16>, in which the through electrode electrically connects the PAD electrode and the third semiconductor element to each other.

<19>

An imaging apparatus including:

a solid-state imaging element, the solid-state imaging element including a first semiconductor element having an imaging element for photoelectrically converting incident light, and a second semiconductor element smaller than the first semiconductor element having a signal processing circuit for processing a pixel signal of the imaging element, a circumference of the second semiconductor element being embedded with an embedded member, and a PAD electrode being formed in the embedded member.

<20>

An electronic device including:

a solid-state imaging element, the solid-state imaging element including a first semiconductor element having an imaging element for photoelectrically converting incident light, and a second semiconductor element smaller than the first semiconductor element having a signal processing circuit for processing a pixel signal of the imaging element, a circumference of the second semiconductor element being embedded with an embedded member, and a PAD electrode being formed in the embedded member.

REFERENCE SIGNS LIST

11, 11A to 11D: Solid-state imaging apparatus
31, 31A to 31D: Image sensor
32, 32A to 32D: Through hole
33, 33A to 33D: PAD electrode
34, 34A-1 to 34D-1, 34A-2 to 34D-2: Logic substrate
51, 51A to 51D: On-chip filter
52, 52A to 52D: On-chip lens
53, 53A to 53D: Oxide film
54, 54A to 54D: Embedded member
55, 55A to 55D: Support substrate
111: Solid-state imaging apparatus
131: Image sensor
132: Through hole
133: PAD electrode
134-1, 134-2: Logic substrate
151: On-chip filter
152: On-chip lens
153-1, 153-2: Oxide film
154-1, 154-2: Embedded member
155: Support substrate

What is claimed is:

1. A solid-state imaging element, comprising:

a first semiconductor element that has an imaging element for photoelectrically converting incident light; and a second semiconductor element that is smaller than the first semiconductor element having a signal processing circuit for processing a pixel signal of the imaging element, wherein a circumference of the second semiconductor element is embedded with an embedded member, and a PAD electrode is formed in the embedded member.

2. The solid-state imaging element according to claim 1, wherein a trench is formed in the embedded member, and the PAD electrode is formed in the trench.

3. The solid-state imaging element according to claim 1, wherein the embedded member includes a material with a low dielectric constant.

4. The solid-state imaging element according to claim 1, wherein a through hole that penetrates the first semiconductor element and reaches the PAD electrode is formed directly above the PAD electrode in a direction opposite to an incident direction of the incident light.

5. The solid-state imaging element according to claim 4, wherein the through hole is formed in such a manner as to penetrate the embedded member in addition to the first semiconductor element and to reach the PAD electrode.

6. The solid-state imaging element according to claim 4, wherein a wire connected to an external signal processing apparatus is inserted into the through hole and bonded to the PAD electrode.

7. The solid-state imaging element according to claim 1, further comprising:

a third semiconductor element that has a signal processing circuit for processing a pixel signal of the imaging element and is different from the second semiconductor element, wherein layers each including any one of the first semiconductor element, the second semiconductor element, and the third semiconductor element are laminated in an order of the first semiconductor element, the second semiconductor element, and the third semiconductor element from an incident direction of the incident light.

8. The solid-state imaging element according to claim 7, wherein the third semiconductor element has a same size as the first semiconductor element.

9. The solid-state imaging element according to claim 7, wherein the third semiconductor element is smaller than the first semiconductor element, and, in the layer including the third semiconductor element, a circumference of the third semiconductor element is embedded with another embedded member different from the embedded member.

10. The solid-state imaging element according to claim 9, further comprising:

a support substrate having a same size as the first semiconductor element, wherein layers each including any one of the first semiconductor element, the second semiconductor element, the third semiconductor element, and the support substrate are laminated in the order of the first semiconductor element, the second semiconductor element, the third semiconductor element, and the support substrate from the incident direction of the incident light.

11. The solid-state imaging element according to claim 10, wherein a through hole penetrating the support substrate and the third semiconductor element is formed from a direction opposite to the incident direction of the incident light, inner wall wiring electrically connected to the PAD electrode is formed in an inner wall of the through hole, a rear surface electrode is formed near the through hole on the rear surface side of the support substrate when the incident direction of the incident light is assumed as a front surface, and the rear surface electrode is electrically connected to the PAD electrode via the inner wall wiring.

12. The solid-state imaging element according to claim 9, wherein each of the second semiconductor element and the third semiconductor element includes a silicon layer and a wiring layer, and the silicon layer and the wiring layer are laminated in a same order with respect to the incident direction of the incident light.

13. The solid-state imaging element according to claim 9, wherein each of the second semiconductor element and the third semiconductor element includes a silicon layer and a wiring layer, and the silicon layer and the wiring layer are laminated in a different order with respect to the incident direction of the incident light.

14. The solid-state imaging element according to claim 9, wherein the second semiconductor element includes a silicon layer and a wiring layer, and includes a through electrode formed by penetrating the silicon layer.

15. The solid-state imaging element according to claim 9, wherein a plurality of the third semiconductor elements are arranged in a same layer.

16. The solid-state imaging element according to claim 9, wherein a through electrode penetrating the embedded member is formed.

17. The solid-state imaging element according to claim 16, wherein the through electrode electrically connects the first semiconductor element and the third semiconductor element to each other.

18. The solid-state imaging element according to claim 16, wherein the through electrode electrically connects the PAD electrode and the third semiconductor element to each other.

19. An imaging apparatus, comprising:

a solid-state imaging element, the solid-state imaging element including:

a first semiconductor element having an imaging element for photoelectrically converting incident light; and a second semiconductor element smaller than the first semiconductor element having a signal processing circuit for processing a pixel signal of the imaging element, a circumference of the second semiconductor element being embedded with an embedded member, and a PAD electrode being formed in the embedded member.

20. An electronic device, comprising:

a solid-state imaging element, the solid-state imaging element including:

a first semiconductor element having an imaging element for photoelectrically converting incident light; and a second semiconductor element smaller than the first semiconductor element having a signal processing circuit for processing a pixel signal of the imaging element, a circumference of the second semiconductor element being embedded with an embedded member, and a PAD electrode being formed in the embedded member.

* * * * *